US 9,876,107 B2

(12) United States Patent
Yanagi

(10) Patent No.: US 9,876,107 B2
(45) Date of Patent: Jan. 23, 2018

(54) SEMICONDUCTOR DEVICE HAVING SEMICONDUCTOR ELEMENTS ON SEMICONDUCTOR SUBSTRATE

(71) Applicant: DENSO CORPORATION, Kariya, Aichi-pref. (JP)

(72) Inventor: Shinichiro Yanagi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/904,245

(22) PCT Filed: Jul. 14, 2014

(86) PCT No.: PCT/JP2014/003712
§ 371 (c)(1),
(2) Date: Jan. 11, 2016

(87) PCT Pub. No.: WO2015/008473
PCT Pub. Date: Jan. 22, 2015

(65) Prior Publication Data
US 2016/0172485 A1    Jun. 16, 2016

(30) Foreign Application Priority Data

Jul. 16, 2013  (JP) ................................. 2013-147634
Jun. 13, 2014  (JP) ................................. 2014-122673

(51) Int. Cl.
*H01L 29/78*    (2006.01)
*H01L 27/02*    (2006.01)
(Continued)

(52) U.S. Cl.
CPC ...... *H01L 29/7816* (2013.01); *H01L 27/0207* (2013.01); *H01L 29/0619* (2013.01);
(Continued)

(58) Field of Classification Search
CPC .................................................. H01L 29/7816
See application file for complete search history.

(56) References Cited

U.S. PATENT DOCUMENTS 6,037,636 A * 3/2000 Crippen .............. H01L 27/0266
                                                        257/328
6,281,549 B1 * 8/2001 Davies ................ H01L 29/7816
                                                        257/335
(Continued)

FOREIGN PATENT DOCUMENTS

JP    H05-335563 A    12/1993
JP    H09-129867 A     5/1997
(Continued)

OTHER PUBLICATIONS

International Search Report of the International Searching Authority dated Oct. 14, 2014 issued in the corresponding International application No. PCT/JP2014/003712 (and English translation).
(Continued)

*Primary Examiner* — Eugene Lee
(74) *Attorney, Agent, or Firm* — Posz Law Group, PLC

(57)    ABSTRACT

A semiconductor device includes a semiconductor substrate and a semiconductor element arranged on a predetermined surface side of the semiconductor substrate. The semiconductor element includes: a first region portion at which a first conductivity type semiconductor region is arranged on the surface side of the semiconductor substrate; a second region portion at a position separated from the first region portion; and a gate electrode arranged between the first region portion and the second region portion through an insulating film. In the first region portion, a first conductivity type semiconductor region is arranged. In the second region portion, a first conductivity type semiconductor region and a second conductivity type semiconductor region are alternately arranged. The semiconductor structure portions with
(Continued)

a variety of types having ratios of the first conductivity type semiconductor region to the second conductivity type semiconductor region different from each other are provided at the second region portion.

10 Claims, 16 Drawing Sheets

(51) Int. Cl.
 H01L 29/66 (2006.01)
 H01L 29/06 (2006.01)
 H01L 29/08 (2006.01)
 H01L 29/10 (2006.01)

(52) U.S. Cl.
 CPC ........ *H01L 29/0696* (2013.01); *H01L 29/086* (2013.01); *H01L 29/0865* (2013.01); *H01L 29/0869* (2013.01); *H01L 29/0882* (2013.01); *H01L 29/1095* (2013.01); *H01L 29/66681* (2013.01); *H01L 29/0653* (2013.01)

(56) References Cited

U.S. PATENT DOCUMENTS

| | | | | |
|---|---|---|---|---|
| 7,023,050 B2* | 4/2006 | Salama | ............... | H01L 29/0634 257/335 |
| 7,528,444 B2* | 5/2009 | Sutardja | ............ | H01L 21/76816 257/342 |
| 7,851,889 B2* | 12/2010 | Zhu | ..................... | H01L 29/0692 257/401 |
| 2003/0006467 A1* | 1/2003 | Mattei | ................. | H01L 29/4175 257/401 |
| 2004/0046202 A1* | 3/2004 | Nakayama | .......... | H01L 29/4175 257/302 |
| 2006/0033153 A1* | 2/2006 | Onishi | ................ | H01L 29/0634 257/328 |
| 2011/0115016 A1* | 5/2011 | Cha | ................... | H01L 21/76264 257/337 |

FOREIGN PATENT DOCUMENTS

| | | |
|---|---|---|
| JP | 2000-307123 A | 11/2000 |
| JP | 2012-064830 A | 3/2012 |
| JP | 2013-074238 A | 4/2013 |

OTHER PUBLICATIONS

Written Opinion of the International Searching Authority dated Oct. 14, 2014 issued in the corresponding International application No. PCT/JP2014/003712(and English translation).

Office Action dated Oct. 27, 2015 issued in the corresponding JP application No. 2014-122673 (and English translation).

\* cited by examiner

SEMICONDUCTOR DEVICE HAVING SEMICONDUCTOR ELEMENTS ON SEMICONDUCTOR SUBSTRATE

CROSS REFERENCE TO RELATED APPLICATIONS

This application is the U.S. national phase of International Patent Application No. PCT/JP2014/003712 filed on Jul. 14, 2014 and is based on Japanese Patent Application No. Japanese Patent Application No. 2013-147634 filed on Jul. 16, 2013 and Japanese Patent Application No. 2014-122673 filed on Jun. 13, 2014, the disclosures of which are incorporated herein by reference.

TECHNICAL FIELD

The present disclosure relates to a semiconductor device.

BACKGROUND ART

A semiconductor device, for example, as disclosed in Patent Literature 1 is provided as a lateral semiconductor device such as an LDMOS. In an example of FIG. 1 in Patent Literature 1, an N-conductive type drain region 104 and a source region 106 are provided on a surface side of a semiconductor substrate. In the source region 106, an N-conductive type diffusion region and a P-conductive type diffusion region are alternately disposed. A gate electrode 109 is disposed between the drain region and the source region through an insulating film on the semiconductor substrate.

PRIOR ART LITERATURES

Patent Literature

Patent Literature 1: JP-2000-307123-A

SUMMARY OF INVENTION

In the semiconductor device such as an LDMOS, a gap between one diffusion region (for example, source region) and another diffusion region (for example, drain region) which are disposed on both sides of a channel region is adjusted and thus tolerance may be changed. However, solely with this method, there is a difficulty in that ON-resistance is increased if the gap is widened so as to increase tolerance. Particularly, in a case of an element requiring more large tolerance, since more increasing of the gap between the diffusion regions is needed, a great increase of the ON-resistance is not avoided and loss in area occurs. Conversely, when the ON-resistance is considered as important and the gap between the diffusion regions is reduced, the tolerance is necessarily decreased.

The present disclosure is to provide a configuration in which a region which considers tolerance as relatively important and a region which considers ON-resistance as relatively important are separately formed in the same device, and thus loss in area is suppressed and efficient disposition is easily performed.

According to a certain aspect of the present disclosure, there is provided a semiconductor device which includes a semiconductor substrate and at least one of semiconductor elements. The semiconductor elements are formed on a predetermined surface side of the semiconductor substrate. The semiconductor element includes a first region portion, a second region portion, and a gate electrode. In the first region portion, a first conductivity type semiconductor region is formed on the surface side of the semiconductor substrate. The second region portion is formed at a position separated from the first region portion on the surface side of the semiconductor substrate. In the second region portion, a semiconductor structure portion at which the first conductivity type semiconductor region and a second conductivity type semiconductor region are alternately provided is disposed. The gate electrode is disposed on a region between the first region portion and the second region portion with an insulating film interposed between the region and the gate electrode in the semiconductor substrate. In the second region portion, plural types of semiconductor structure portions which have ratios of the first conductivity type semiconductor region and the second conductivity type semiconductor region different from each other are provided.

In the semiconductor device according to this aspect, the plural types of semiconductor structure portions are provided in the second region portion formed in at least one of the semiconductor elements in the semiconductor device. In the device, the plural types of semiconductor structure portions which have ratios of the first conductivity type semiconductor region and the second conductivity type semiconductor region different from each other are provided.

The ratio of the first conductivity type semiconductor region and the second conductivity type semiconductor region in the semiconductor structure portion is a factor contributing to setting of tolerance and ON-resistance. A structure which causes the tolerance to be increased more, or a structure which causes the ON-resistance to be reduced more can be obtained by changing the ratio. Accordingly, if a ratio in a first conductivity type and a ratio in a second conductivity type in the semiconductor structure portion are not determined uniformly, but are set individually for each region, balance of the tolerance and the ON-resistance in each region in a state appropriate for each region can be determined. In addition, in a region in which the tolerance is relatively regarded as important, a gap between the first region portion and the second region portion is not increased much and a ratio in the second region portion is adjusted. Thus, the tolerance can be increased. Accordingly, loss in area is effectively suppressed.

In the present disclosure, "a ratio of the first conductivity type semiconductor region and the second conductivity type semiconductor region in the semiconductor structure portion" may be "a ratio of an area of the first conductivity type semiconductor region and an area of the second conductivity type semiconductor region on an upper surface of the semiconductor structure portion", "a ratio of a length of the first conductivity type semiconductor region and a length of the second conductivity type semiconductor region at a boundary portion on the first region portion side on the upper surface of the semiconductor structure portion", or "a ratio of a volume of the first conductivity type semiconductor region and a volume of the second conductivity type semiconductor region in the semiconductor structure portion". "A configuration in which plural types of semiconductor structure portions having ratios of the first conductivity type semiconductor region and the second conductivity type semiconductor region different from each other are provided" includes the following configuration in which disposition structures of the first conductivity type semiconductor region and the second conductivity type semiconductor region are different from each other at plural positions of the second region. For example, "the configuration in which plural types of semiconductor structure portions having ratios of the first conductivity type semiconductor region and the second conductivity type semiconductor region different from each other are provided" may be "a configuration in which the plural types of the semiconductor structure portions which have ratios of the area of the first conductivity type semiconductor region and the area of the second conductivity type semiconductor region on the upper surface different from each other are provided", "a configuration in which the plural types of the semiconductor structure portions which have the ratios of the length of the first conductivity type semiconductor region and the length of the second conductivity type semiconductor region at the boundary portion on the first region portion side on the upper surface different from each other are provided", or "a configuration in which the plural types of the semiconductor structure portions which have ratios of the volume of the first conductivity type semiconductor region and the volume of the second conductivity type semiconductor region different from each other are provided".

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

First Embodiment

Hereinafter, a first embodiment obtained by embodying the present disclosure will be described below with reference to the drawings.

Figure 1:
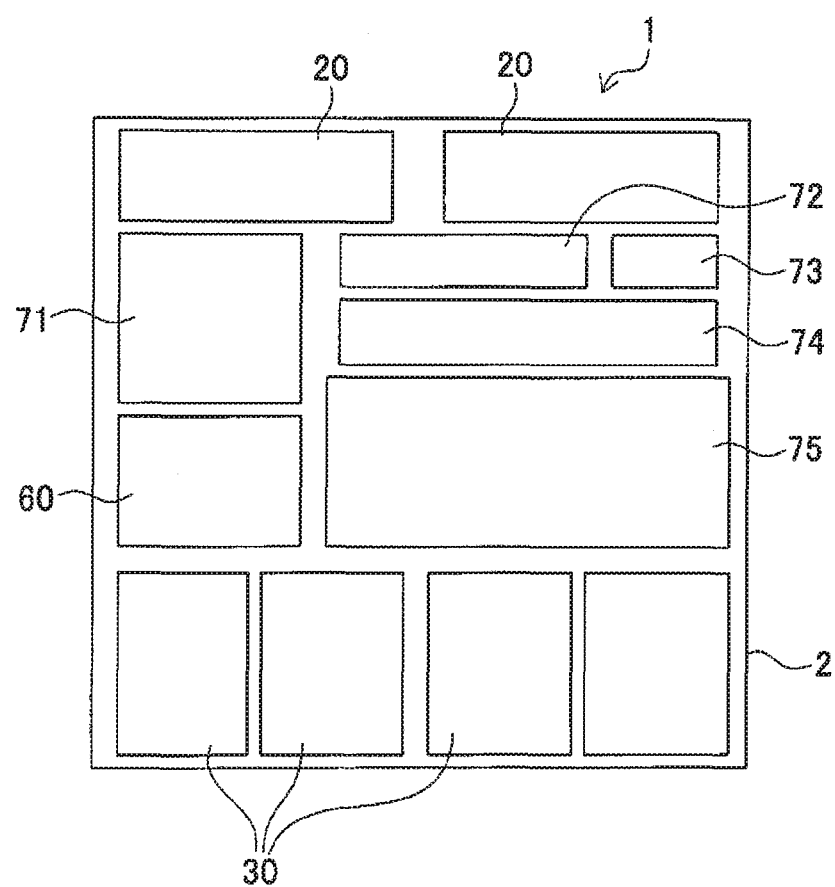
FIG. 1 is a schematic diagram schematically illustrating a planar configuration of a semiconductor device according to a first embodiment of the present disclosure.
Figure 3A:
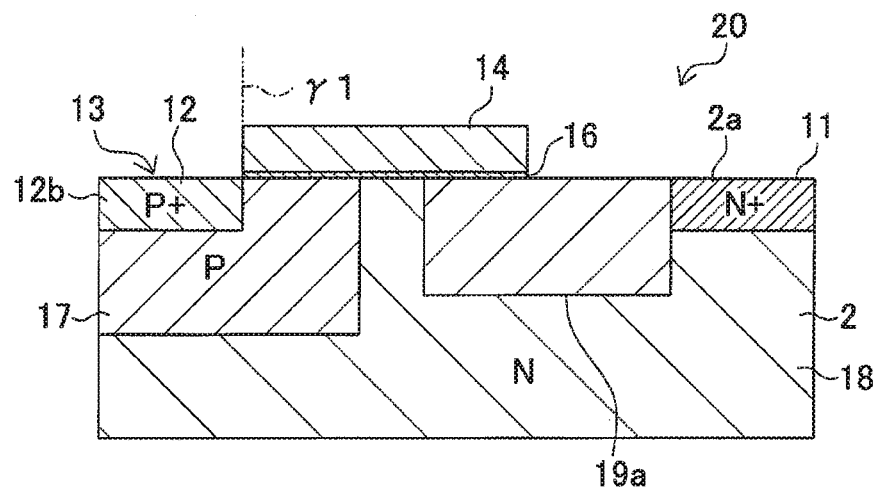
FIG. 3A is a schematic sectional diagram schematically illustrating a sectional configuration at a position of IIIA-IIIA in the semiconductor element of FIG. 2.
Figure 3B:
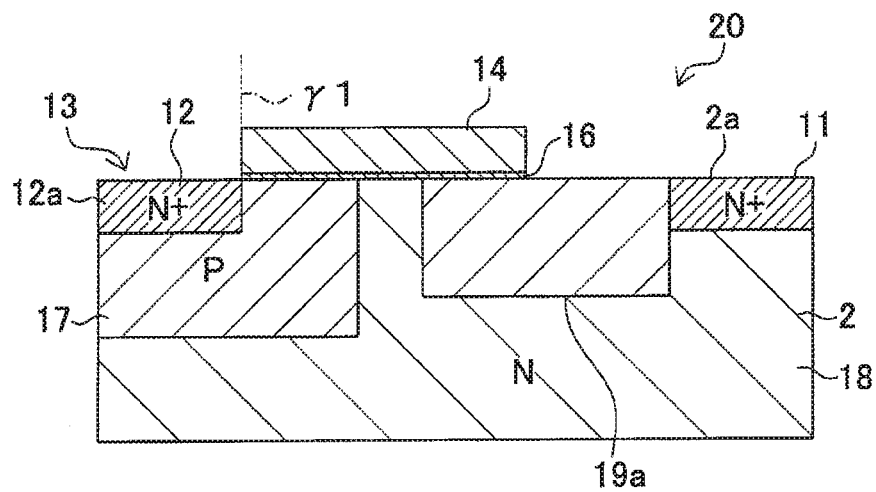
FIG. 3B is a schematic sectional diagram schematically illustrating a sectional configuration at a position of IIIB-IIIB in the semiconductor element of FIG. 2.

In a semiconductor device 1 illustrated in FIG. 1, plural semiconductor elements are provided on a surface 2a side of a semiconductor substrate 2 illustrated in FIGS. 3A, 3B, and the like. In the example of FIG. 1, elements such as a bipolar transistor 71, a resistive element 72, a memory 73, a capacitor 74, and a CMOS 75 are disposed on the semiconductor substrate 2, in addition to semiconductor elements 20, 30, and 60 formed as an LDMOS.

In this configuration, a known SOI substrate in which an insulating film (not illustrated) is interposed between the semiconductor substrate 2 as an element formation substrate and a support substrate (not illustrated) is used as a substrate constituting the semiconductor device 1. Thus, an n-type silicon substrate is used as the semiconductor substrate 2, a silicon substrate is used as the support substrate, and, for example, SiO2 is used as the insulating film between the substrates. Thus, the above-described elements are formed on the surface 2a side of the semiconductor substrate 2 (element formation substrate). Here, the SOI substrate is exemplified as a representative example. However, the semiconductor substrate 2 may be a bulk substrate.

Figure 2:
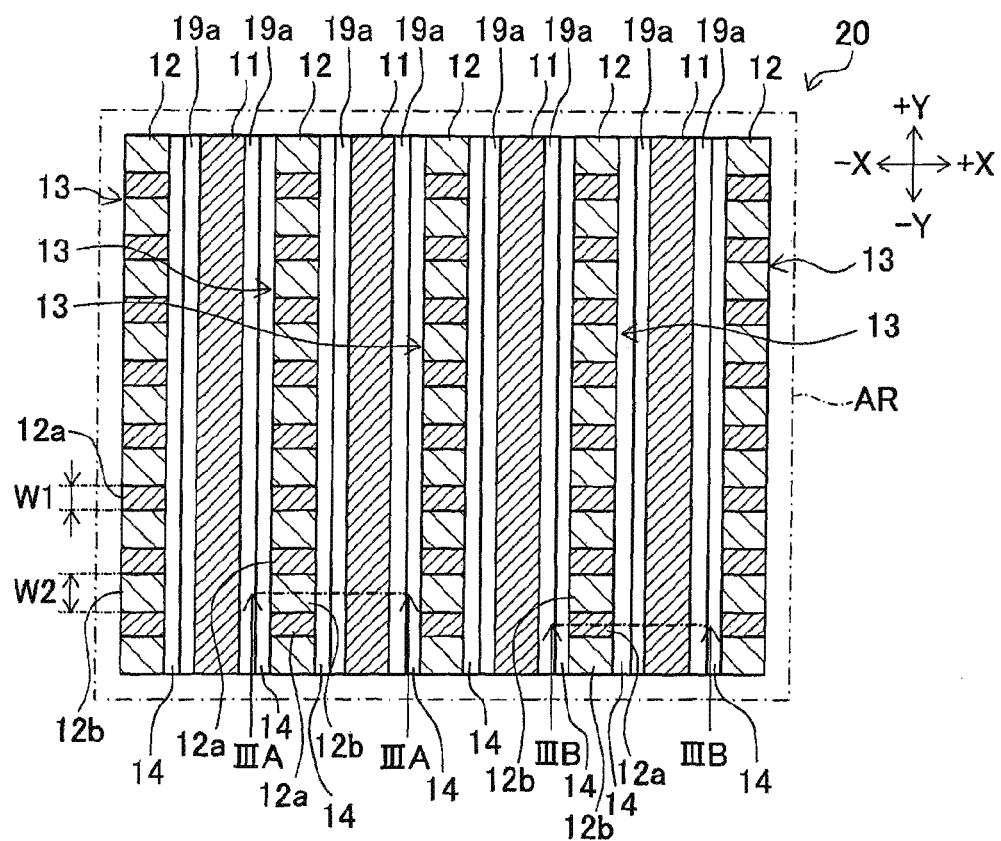
FIG. 2 is a schematic diagram schematically illustrating a planar configuration of a surface side of a semiconductor element provided in the semiconductor device of FIG. 1.

Here, a configuration common in the semiconductor elements 20 and 30 will be described. FIG. 2 illustrates an example of the semiconductor element 20. However, the semiconductor element 30 is the same as the semiconductor element 20 only except for an inner configuration (ratio of an N+ diffusion region 12a and a P+ diffusion region 12b) of a second region portion 12. Particularly, a cutoff view obtained by cutting the semiconductor element 30 at a position of the P+ diffusion region 12b in a transverse direction is the same as that in FIG. 3A and a cutoff view obtained by cutting the semiconductor element 30 at a position of the N+ diffusion region 12a in the transverse direction is the same as that in FIG. 3B.

Any of the semiconductor elements 20 and 30 is formed as an LDMOS transistor. As illustrated in FIG. 2, first region portions 11 and second region portions 12 are alternately formed at a surface layer portion of the N-type semiconductor substrate 2. The first region portion 11 is a region corresponding to a drain of the LDMOS transistor. The second region portion 12 is a region corresponding to a source of the LDMOS transistor. FIG. 2 illustrates a schematic structure of a surface layer portion of a portion (portion of the semiconductor element 20) in the semiconductor substrate 2 in a plan view, and regions other than the first region portion 11 and the second region portion 12 are not illustrated.

The first region portion 11 is formed on the surface 2a side of the semiconductor substrate 2, as an N-conductive type semiconductor region which is extended in a predetermined direction so as to have a longitudinal shape. In this description, a predetermined one direction of planar directions parallel with the surface of the semiconductor substrate 2 is set as an X direction, and a direction of the planar directions orthogonal to the X direction is set as a Y direction (see FIG. 2). The Y direction corresponds to the predetermined direction. The plural first region portions 11 are extended in the Y direction so as to have a longitudinal shape, for example, with an outward structure of a rectangular shape in a plan view. In this configuration, an N-conductive type (N-type) is set as a first conductivity type and a P-conductive type is set as a second conductivity type. The first region portion 11 is formed as an N-conductive type diffusion region (N+ diffusion region) having a concentration higher than that of an N region 18 of the semiconductor substrate 2 and functions as a drain region which is electrically connected to a drain electrode (not illustrated).

As illustrated in FIGS. 3A and 3B, an insulating film 19a is formed as a field oxide film at a position adjacent to each of the first region portions 11 in the vicinity of the surface 2a of the semiconductor substrate 2. The insulating film 19a is formed of SiO2, for example. The insulating film 19a is formed so as to have one end side which is adjacent to the first region portion 11 (N+ diffusion region) in the transverse direction (X direction) and the other end side which is disposed at a position under a gate electrode 14 (which will be described later) in the vicinity of the surface layer portion of the semiconductor substrate 2. Thus, the insulating film 19a is adjacent to the first region portion 11 and is extended in the Y direction so as to have a longitudinal shape along the first region portion 11.

The second region portion 12 is formed on the surface 2a side of the semiconductor substrate 2, as a region which is extended in the predetermined direction (Y direction) so as to have a longitudinal shape. In this configuration, the plural second region portions 12 are extended at a gap in the Y direction illustrated in FIG. 2 so as to have a longitudinal shape. Each of the second region portions 12 is disposed at a position separated from the first region portions 11 between the plurality of first region portions 11 which are arranged along the X direction (between the first region portions 11 which are adjacent to each other). The second region portion 12 has a rectangular outward structure in a plan view. The second region portion 12 is formed by a semiconductor structure portion 13 in which an N-conductive type diffusion region (N+ diffusion region 12a) and a P-conductive type diffusion region (P+ diffusion region 12b) are alternately provided in the Y direction, as illustrated in FIG. 2. The second region portion 12 functions as a source region which is electrically connected to a source electrode (not illustrated). In this configuration, regarding the first region portions 11 and the second region portions 12 illustrated in FIG. 2, all of gaps between the first region portions 11 and the second region portions 12 which are adjacent to each other are substantially the same as each other. The gap is a gap between the center position of the first region portion 11 in the transverse direction and the center position of the second region portion 12 which is adjacent to the first region portion 11, in the transverse direction, and is also referred to as a source-drain gap L1. The more specific configuration of the second region portion 12 will be described later.

As illustrated in FIGS. 3A, 3B, 4A, and 4B, a P-conductive type body region 17 is formed around the second region portion 12 formed at the surface layer portion of the semiconductor substrate 2. A portion (portion right under the gate electrode 14) of the body region 17 on the surface layer portion which is adjacent to the second region portion 12 functions as a channel region.

As illustrated in FIGS. 3A, 3B, 4A, and 4B, the gate electrode 14 is disposed over a region between the first region portion 11 and the second region portion 12 in the semiconductor substrate 2, with an insulating film 16 interposed between the region and the gate electrode 14. The insulating film 16 and the gate electrode 14 are formed across the body region 17, the region of the semiconductor substrate 2 (N region 18) between the body region 17 and the insulating film 19a, and a portion of the insulating film 19a. The insulating film 16 and the gate electrode 14 are disposed over these components and are extended in a direction (that is, Y direction) in which the first region portion 11 and the second region portion 12 are extended, so as to have a longitudinal shape. In FIG. 2, the gate electrode 14 and the like is omitted. In the example of FIGS. 3A, 3B, and the like, a configuration (insulating film, wiring, or the like) on an upper part side of the semiconductor substrate 2 or the gate electrode 14 is omitted.

In this manner, the surface layer portion of any of the semiconductor elements 20 and 30 has a stripe-like structure in which the longitudinal first region portions 11 (drain region) and the longitudinal second region portions 12 (source region) are alternately disposed in the transverse direction (X direction). The semiconductor elements 20 and 30 which have such a configuration are formed in an element region AR having a predetermined range in the semiconductor substrate 2. Such plural element regions are provided in the semiconductor device 1. For example, in the example of FIG. 1, two element regions in which the semiconductor elements 20 are formed are provided, and three element regions in which the semiconductor elements 30 are formed are provided. FIG. 1 schematically illustrates only a region of each element formed in the semiconductor substrate 2 within a rectangular frame. In FIG. 1, a specific illustration of the configuration is omitted.

Next, the configuration of the semiconductor element 20 will be described in detail.

Figure 4A:
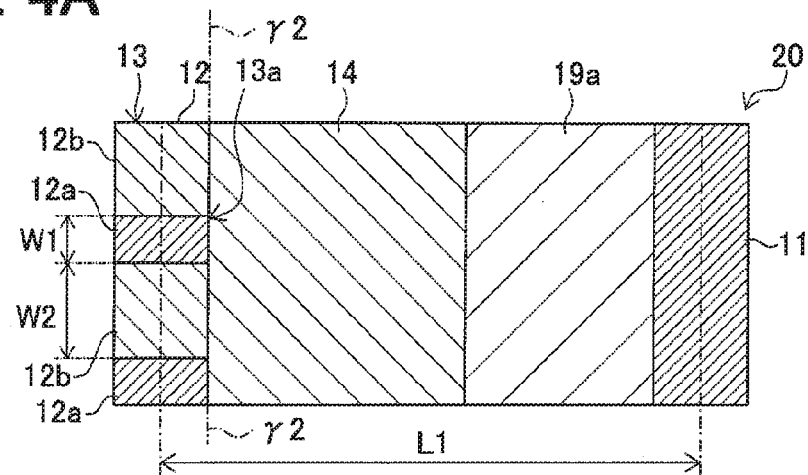
FIG. 4A is a diagram partially illustrating a planar configuration of a first region portion, a second region portion, a gate electrode, and the like in the semiconductor element of FIG. 2.

As illustrated in FIG. 2, in each of the second region portions 12 (source region) in the semiconductor element 20, N-conductive type semiconductor regions (N+ diffusion regions 12a) and P-conductive type semiconductor regions (P+ diffusion regions 12b) are alternately disposed in the predetermined direction (Y direction illustrated in FIG. 2) in which each of the second region portions 12 is extended, as described above. As illustrated in FIG. 4A, a ratio for the N+ diffusion regions 12a is different from a ratio for the P+ diffusion regions 12b. Specifically, in each of the second region portions 12, a ratio of the volume of the P+ diffusion regions 12b (P+ active portion) to the total volume of each of the second region portions 12 is greater than a ratio of the volume of the N+ diffusion regions 12a (N+ active portion) to the total volume of each of the second region portions 12. That is, in each of the second region portions 12, the P+ diffusion regions 12.b are disposed so as to be greater than the N+ diffusion regions 12a. In the example of FIG. 4A, the volume of the P+ diffusion regions 12b is set to be substantially twice the volume of the N+ diffusion regions 12a in each of the second region portions.

In this configuration, as illustrated in FIG. 2, all of the second region portions 12 constituting a portion of the semiconductor element 20 are formed by the same type of the semiconductor structure portions 13, and the semiconductor structure portions 13 having the same structure are disposed at a gap in the X direction. In each of the longitudinal semiconductor structure portions 13 constituting the second region portion 12, all of the P+ diffusion regions 12b which are disposed at a gap have substantially the same shape and all of the N+ diffusion regions 12a which are disposed at a gap have substantially the same shape. For this reason, in each of the longitudinal semiconductor structure portions 13 constituting the second region portion 12, all of the P+ diffusion regions 12b have substantially the same volume as each other, and all of the N+ diffusion regions 12a have substantially the same volume as each other. The volume of any of the P+ diffusion regions 12b is greater than the volume of any of the N+ diffusion regions 12a, and, for example, the volume of one P+ diffusion region 12b is substantially twice the volume of one N+ diffusion region 12a. With such a configuration, in all of the longitudinal semiconductor structure portions 13 constituting the second region portion 12, the volume of the P+ diffusion region 12b is substantially twice the volume of the N+ diffusion region 12a.

Upper surface areas of the P+ diffusion regions 12b are substantially the same area as each other, and upper surface areas of the N+ diffusion regions 12a are substantially the same area as each other. All of the upper surface areas of the P+ diffusion regions 12b are greater than all of the upper surface areas of the N+ diffusion regions 12a. For example, the upper surface area of one P+ diffusion region 12b is substantially twice the upper surface area of one N+ diffusion region 12a. With such a configuration, in the upper surface of the longitudinal second region portion 12, a ratio of the area (area of the upper surface) of the N+ diffusion region 12a and the area (area of the upper surface) of the P+ diffusion region 12b does not satisfy 1:1, and the total area of the upper surfaces of the P+ diffusion regions 12b is greater than (for example, substantially twice) the total area of the upper surfaces of the N+ diffusion regions 12a. In the semiconductor element 20 illustrated in FIG. 2, all of the second region portions 12 are formed by the same type of the semiconductor structure portions 13. In this manner, in an example in which the second region portion 12 is formed so as to have a longitudinal shape, the same type of the semiconductor structure portions 13 mean regions in which the N+ diffusion regions 12a and the P+ diffusion regions 12b are alternately disposed such that the N+ diffusion regions 12a having the same structure are disposed at a gap and the P+ diffusion region 12b having the same structure are disposed at a gap in an upper surface portion. In the semiconductor element 30 illustrated in FIG. 2, since all of the second region portions 12 have such a structure, it may be called that all of the second region portions 12 are formed by the same type of the semiconductor structure portions 13.

Figure 4B:
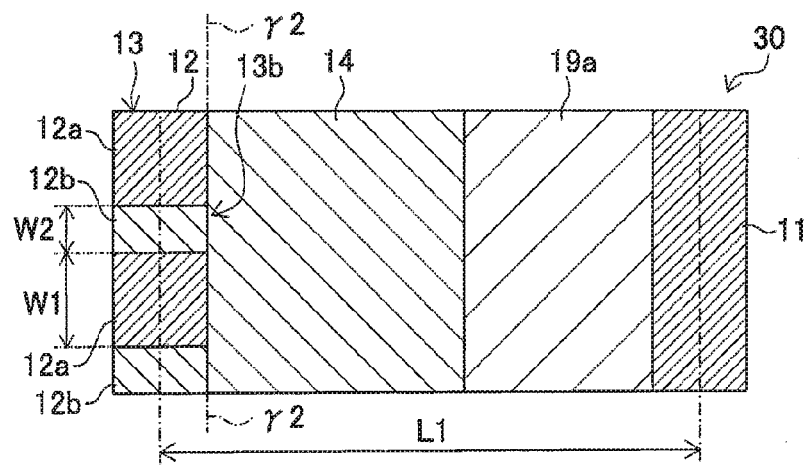
FIG. 4B is a diagram partially illustrating a planar configuration of a first region portion, a second region portion, a gate electrode, and the like in a different type of the semiconductor element from that in FIG. 4A.

Regarding each of the longitudinal semiconductor structure portions 13 constituting the second region portion 12, a ratio of the sum of lengths of the N+ diffusion regions 12a and the sum of lengths of the P+ diffusion regions 12b at a boundary portion of the first region portion 11 side does not satisfy 1:1 on the upper surface of the longitudinal semiconductor structure portion 13. The sum of the lengths of the P+ diffusion regions 12b is substantially twice the sum of the lengths of the N+ diffusion regions 12a. In the example of FIG. 2, two long-side portions of each of the semiconductor structure portions 13 which are formed so as to be rectangular correspond to the boundary portion of the first region portion 11 side in the semiconductor structure portion 13. At this boundary portion, the sum of the lengths of the P+ diffusion regions 12b is greater than the sum of the lengths of the N+ diffusion regions 12a. For example, the sum of the lengths of the P+ diffusion regions 12b is substantially twice the sum of the lengths of the N+ diffusion regions 12a. In FIGS. 3A and 3B, a boundary of the first region portion 11 side in the semiconductor structure portion 13 is schematically indicated by γ1. In FIGS. 4A and 4B, a boundary of the first region portion 11 side in the semiconductor structure portion 13 is schematically indicated by γ2. The boundary portion of the first region portion 11 side in the semiconductor structure portion 13 corresponds to a portion constituting such a boundary.

More specifically, each of the N+ diffusion regions 12a has a rectangular shape which has a predetermined width and is extended in the transverse direction (X direction) in a plan view. In the second region portion 12, the N+ diffusion regions 12a are disposed at a constant gap. The width (length in the Y direction) of the N+ diffusion region 12a is set as a width W1. Each of the P+ diffusion regions 12b has a rectangular shape which has a predetermined width and is extended in the transverse direction (X direction) in a plan view. In the second region portion 12, the P+ diffusion regions 12b are disposed at a constant gap. The width (length in the Y direction) of the P+ diffusion region 12b is set as a width W2. The width W2 of each of the P+ diffusion regions 12b is greater than the width W1 of each of the N+ diffusion regions 12a. In this configuration, the length of the boundary portion (boundary portion of the first region portion 11 side) formed on both of the right and the left sides corresponds to the W1 on a surface of one N+ diffusion region 12a. Thus, in all of the N+ diffusion regions 12a, the length of the boundary portion (boundary portion of the first region portion 11 side) formed on both of the right and the left sides corresponds to the W1. The length of the boundary portion (boundary portion of the first region portion 11 side) formed on both of the right and the left sides corresponds to the W2 on a surface of one P+ diffusion region 12b. Thus, in all of the P+ diffusion regions 12b, the length of the boundary portion (boundary portion of the first region portion 11 side) formed on both of the right and the left sides corresponds to the W2. The length W2 of the boundary portion of one P+ diffusion region 12b is greater than the length W1 of the boundary portion of one N+ diffusion region 12a. For example, the length W2 of the boundary portion of one P+ diffusion region 12b is substantially twice the length W1 of the boundary portion of one N+ diffusion region 12a. The depth of each of the N+ diffusion regions 12a is substantially the same as the depth of each of the P+ diffusion regions 12b, for example. With such a configuration, in each of the second region portions 12, the percentage of the P+ diffusion regions 12b is greater than the percentage of the N+ diffusion regions 12a.

Figure 4C:
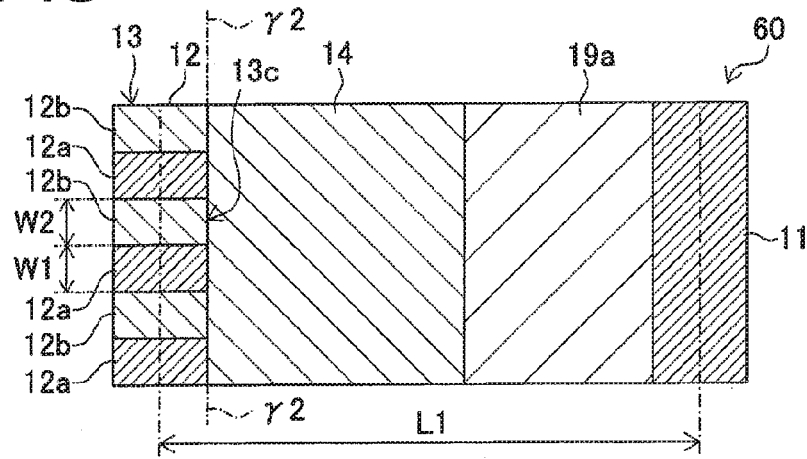
FIG. 4C is a diagram partially illustrating a planar configuration of a first region portion, a second region portion, a gate electrode, and the like in a different type of the semiconductor element from those in FIGS. 4A and 4B.

With such a configuration, the semiconductor element 20 has high ESD tolerance and high L-load tolerance and is made so as to be an element in which these types of tolerance are regarded as important, in comparison to a configuration as in FIG. 4C. The semiconductor element 60 in FIG. 4C is an LDMOS transistor which has the same structure as the semiconductor element 20 except for the second region portion 12. The source-drain gap L1 of the semiconductor element 60 between the source region and the drain region is the same as that of the semiconductor element 20.

In the semiconductor element 60, the width W1 of each of the N+ diffusion regions 12a is substantially the same as the width W2 of each of the P+ diffusion regions 12b. The percentage of the P+ diffusion regions 12b is substantially the same as the percentage of the volume of the N+ diffusion regions 12a in the second region portion 12. On the contrary, in the semiconductor element 20, a pitch L1 between the source and the drain is not great, the ESD tolerance is higher than that of the semiconductor element 60, and the L-load tolerance is high. Thus, the semiconductor element 20 has an advantage in that the tolerance is increased with suppression of loss in area. In FIGS. 4A, 4B, and 4C, L1 is used for indicating a gap between the center position of the first region portion 11 in a width direction and the center position of the second region portion 12 in a width direction, as a source-drain gap (source-drain pitch).

Here, the semiconductor element 60 will be described. The semiconductor element 60 illustrated in FIG. 4C has the same structure as the semiconductor element 20 illustrated in FIG. 2 and the like only except that the width W1 of each of the N+ diffusion regions 12a in the semiconductor element 60 is different from the width W1 of each of the N+ diffusion regions 12a in the semiconductor element 20, and the width W2 of the P+ diffusion region 12b in the semiconductor element 60 is different from the width W2 of the P+ diffusion region 12b in the semiconductor element 20. In each of the second region portions 12 (source regions) of the semiconductor element 60, as described above, N-conductive type semiconductor regions (N+ diffusion regions 12a) and P-conductive type semiconductor regions (P+ diffusion regions 12b) are alternately disposed in the predetermined direction in which each of the second region portions 12 is extended. FIG. 4C partially illustrates a portion between the first region portion 11 (drain region) and the second region portion 12 (source region) at a portion of the semiconductor element 60. However, each of the first region portions 11 and each of the second region portions 12 are practically longer than those in FIG. 4C. For example, the first region portions 11 and the second region portions 12 are substantially the same as the first region portions 11 and the second region portions 12 illustrated in FIG. 2. In each of the second region portions 12, multiple N+ diffusion regions 12a and multiple P+ diffusion regions 12b which have sizes illustrated in FIG. 4C are alternately disposed with repetition in practice. The first region portion 11 is formed as an N+ diffusion region and is formed so as to have substantially the same length as that of such a second region portion 12. Similarly to the semiconductor element 20, the first region portions 11 and the second region portions 12 which are formed in this manner are alternately disposed at a gap in the transverse direction (direction orthogonal to a longitudinal direction of the first region portions 11 and the second region portions 12).

In this semiconductor element 60, all of the second region portions 12 are also formed by the same type of the semiconductor structure portions 13, and the semiconductor structure portions 13 having the same structure are disposed at a gap in the X direction. In each of the longitudinal semiconductor structure portions 13, all of the P+ diffusion regions 12b which are disposed at a gap have substantially the same shape and all of the N+ diffusion regions 12a which are disposed at a gap have substantially the same shape. For this reason, in each of the longitudinal semiconductor structure portions 13 constituting the second region portion 12 of the semiconductor element 60, all of the P+ diffusion regions 12b have substantially the same volume as each other, and all of the N+ diffusion regions 12a have substantially the same volume as each other. The volume of each of the P+ diffusion regions 12b is substantially the same as the volume of each of the N+ diffusion regions 12a.

In this semiconductor element 60, upper surface areas of the P+ diffusion regions 12b are substantially the same area as each other, and upper surface areas of the N+ diffusion regions 12a are substantially the same area as each other. All of the upper surface areas of the P+ diffusion regions 12b are substantially the same as all of the upper surface areas of the N+ diffusion regions 12a. The upper surface area of one P+ diffusion region 12b is substantially the same as the upper surface area of one N+ diffusion region 12a. With such a configuration, in the upper surface of the longitudinal second region portion 12, a ratio of the area (area of the upper surface) of the N+ diffusion region 12a and the area (area of the upper surface) of the P+ diffusion region 12b satisfies 1:1.

In addition, in this semiconductor element 60, the length W1 of the boundary portion of the first region portion 11 side in the N+ diffusion region 12a is the same as the length W2 of the boundary portion of the first region portion 11 side in the P+ diffusion region 12b on the upper surface of each of the longitudinal semiconductor structure portions 13. A ratio of the sum of lengths of the N+ diffusion regions 12a and the sum of lengths of the P+ diffusion regions 12b at the boundary portion of the first region portion 11 side satisfies 1:1. In this example, similarly to in FIG. 2, two long-side portions of each of the semiconductor structure portions 13 which are formed so as to be rectangular also correspond to the boundary portion of the first region portion 11 side in the semiconductor structure portion 13. At this boundary portion, the sum of the lengths of the P+ diffusion regions 12b is substantially the same as the sum of the lengths of the N+ diffusion regions 12a.

Next, the configuration of the semiconductor element 30 will be described.

The semiconductor element 30 has the same structure as the semiconductor element 20 illustrated in FIG. 2 except that the width W1 of each of the N+ diffusion regions 12a and the width W2 of each of the P+ diffusion regions 12b in the semiconductor element 30 are different from those in the semiconductor element 20. In each of the second region portions 12 (source regions) of the semiconductor element 30, as described above, N-conductive type semiconductor regions (N+ diffusion regions 12a) and P-conductive type semiconductor regions (P+ diffusion regions 12b) are alternately disposed in the predetermined direction in which each of the second region portions 12 is extended. As illustrated in FIG. 4B, the percentage of the N+ diffusion region 12a is different from the percentage of the P+ diffusion region 12b. FIG. 4B partially illustrates a portion between the first region portion 11 (drain region) and the second region portion 12 (source region) at a portion of the semiconductor element 30. However, each of the first region portions 11 and each of the second region portions 12 are practically longer than those in FIG. 4B. For example, the first region portions 11 and the second region portions 12 are substantially the same as the first region portions 11 and the second region portions 12 illustrated in FIG. 2. In each of the second region portions 12, multiple N+ diffusion regions 12a and multiple P+ diffusion regions 12b which have sizes illustrated in FIG. 4B are alternately disposed with repetition in practice. The first region portion 11 is formed as an N+ diffusion region and is formed so as to have substantially the same length as that of such a second region portion 12. Similarly to the semiconductor element 20, the first region portions 11 and the second region portions 12 which are formed in this manner are alternately disposed at a gap in the transverse direction (direction orthogonal to a longitudinal direction of the first region portions 11 and the second region portions 12).

In each of the second region portions 12 of the semiconductor element 30, the ratio of the volume of the N+ diffusion regions 12a (N+ active portion) to the total volume of each of the second region portions 12 is greater than a ratio of the volume of the P+ diffusion regions 12b (P+ active portion) to the total volume of each of the second region portions 12. That is, in each of the second region portions 12, the N+ diffusion regions 12a are disposed so as to be greater than the P+ diffusion regions 12b. In the example of FIG. 4B, the volume of the N+ diffusion regions 12a is substantially twice the volume of the P+ diffusion regions 12b in each of the second region portions 12.

In the semiconductor element 30, all of the second region portions 12 constituting a portion of the semiconductor element 30 are formed by the same type of the semiconductor structure portions 13, and the semiconductor structure portions 13 having the same structure are disposed at a gap in the X direction. In each of the longitudinal semiconductor structure portions 13 constituting the second region portion 12, all of the P+ diffusion regions 12b which are disposed at a gap have substantially the same shape and all of the N+ diffusion regions 12a which are disposed at a gap have substantially the same shape. For this reason, in each of the longitudinal semiconductor structure portions 13 constituting the second region portion 12, all of the P+ diffusion regions 12b have substantially the same volume as each other, and all of the N+ diffusion regions 12a have substantially the same volume as each other. As illustrated in FIG. 4B, the volume of any of the N+ diffusion regions 12a is greater than the volume of any of the P+ diffusion regions 12b, and, for example, the volume of one N+ diffusion region 12a is substantially twice the volume of one P+ diffusion region 12b. With such a configuration, in all of the longitudinal semiconductor structure portions 13 constituting the second region portion 12, the volume of the N+ diffusion region 12a is substantially twice the volume of the P+ diffusion region 12b.

In the semiconductor element 30, upper surface areas of the P+ diffusion regions 12b are substantially the same area as each other, and upper surface areas of the N+ diffusion regions 12a are substantially the same area as each other. All of the upper surface areas of the N+ diffusion regions 12a are greater than all of the upper surface areas of the P+ diffusion regions 12b. For example, the upper surface area of one N+ diffusion region 12a is substantially twice the upper surface area of one P+ diffusion region 12b. With such a configuration, in the upper surface of the longitudinal second region portion 12, a ratio of the area (area of the upper surface) of the P+ diffusion region 12b and the area (area of the upper surface) of the N+ diffusion region 12a does not satisfy 1:1, and the total area of the upper surfaces of the N+ diffusion regions 12a is greater than (for example, substantially twice) the total area of the upper surfaces of the P+ diffusion regions 12b.

In addition, regarding each of the longitudinal semiconductor structure portions 13 constituting the second region portion 12 in the semiconductor element 30, a ratio of the sum of lengths of the N+ diffusion regions 12a and the sum of lengths of the P+ diffusion regions 12b at a boundary portion of the first region portion 11 side does not satisfy 1:1 on the upper surface of the longitudinal semiconductor structure portion 13. The sum of the lengths of the N+ diffusion regions 12a is substantially twice the sum of the lengths of the P+ diffusion regions 12b. In this semiconductor element 30, long-side portions of each of the semiconductor structure portions 13 which are formed so as to be rectangular correspond to the boundary portion of the first region portion 11 side in the semiconductor structure portion 13. At this boundary portion, the sum of the lengths of the N+ diffusion regions 12a is greater than the sum of the lengths of the P+ diffusion regions 12b. For example, the sum of the lengths of the N+ diffusion regions 12a is substantially twice the sum of the lengths of the P+ diffusion regions 12b.

More specifically, in the semiconductor element 30, each of the N+ diffusion regions 12a also has a rectangular shape which has a predetermined width and is extended in the transverse direction (direction orthogonal to the longitudinal direction of the second region portion 12) in a plan view. In the second region portion 12, the N+ diffusion regions 12a are disposed at a constant gap. The width (length in the longitudinal direction of the second region portion 12) of the N+ diffusion region 12a is set as the width W1. Each of the P+ diffusion regions 12b has a rectangular shape which has a predetermined width and is extended in the transverse direction in a plan view. In the second region portion 12, the P+ diffusion regions 12b are disposed at a constant gap. The width of the P+ diffusion region 12b is set as the width W2. The width W1 of each of the N+ diffusion regions 12a is greater than the width W2 of each of the P+ diffusion regions 12b. In this configuration, the length of the boundary portion (boundary portion of the first region portion 11 side) formed on both of the right and the left sides also corresponds to the W1 on a surface of one N+ diffusion region 12a. Thus, in all of the N+ diffusion regions 12a, the length of the boundary portion (boundary portion of the first region portion 11 side) formed on both of the right and the left sides corresponds to the W1. The length of the boundary portion (boundary portion of the first region portion 11 side) formed on both of the right and the left sides corresponds to the W2 on a surface of one P+ diffusion region 12b. Thus, in all of the P+ diffusion regions 12b, the length of the boundary portion (boundary portion of the first region portion 11 side) formed on both of the right and the left sides corresponds to the W2.

The length W1 of the boundary portion of one N+ diffusion region 12a is greater than the length W2 of the boundary portion of one P+ diffusion region 12b. For example, the length W1 of the boundary portion of one N+ diffusion region 12a is substantially twice the length W2 of the boundary portion of one P+ diffusion region 12b. The depth of each of the N+ diffusion regions 12a is substantially the same as the depth of each of the P+ diffusion regions 12b, for example. With such a configuration, in each of the second region portions 12, the percentage of the N+ diffusion regions 12a is greater than the percentage of the P+ diffusion regions 12b. With such a configuration, the semiconductor element 30 has low ON-resistance and is made so as to be an element in which current capacity is regarded as important, in comparison to the configuration (configuration in which the percentage of the N+ diffusion regions 12a is substantially the same as the percentage of the P+ diffusion region 12b in each of the second region portions 12) as in FIG. 4C.

In this manner, the plural types of the semiconductor elements 20, 30, and 60 having different characteristics from each other are formed in the semiconductor substrate 2 of the semiconductor device 1. In the plurality of semiconductor elements 20, 30, and 60 formed in the same semiconductor substrate 2, different types of semiconductor structure portions 13 are provided. That is, the semiconductor element 20 in which the percentage of the P+ diffusion regions 12b is greater than that of the N+ diffusion regions 12a in each of the second region portion 12, the semiconductor element 30 in which the percentage of the N+ diffusion regions 12a is greater than that of the P+ diffusion regions 12b in each of the second region portion 12, and the semiconductor element 60 in which the N+ diffusion regions 12a and the P+ diffusion regions 12b have substantially the same ratio in each of the second region portion 12 are mixed. That is, the plural types of the semiconductor structure portions 13 in which the ratios of the upper surface area of the N+ diffusion regions 12a and the upper surface area of the P+ diffusion regions 12b are different from each other, and the ratios of the length of the N+ diffusion regions 12a at the boundary portion of the first region portion 11 side on the upper surface and the length of the P+ diffusion regions 12b at the boundary portion of the first region portion 11 side on the upper surface are different from each other are provided.

Specifically, the ratio (W1:W2) of the width W1 of each of the N+ diffusion regions 12a and the width W2 of each of the P+ diffusion regions 12b in the second region portion 12 of one semiconductor element 20 is different from the ratio (W1:W2) of the width W1 of each of the N+ diffusion regions 12a and the width W2 of each of the P+ diffusion regions 12b in the second region portion 12 of another semiconductor element 30. Thus, a volume ratio of the N+ diffusion region 12a and the P+ diffusion region 12b in the second region portion 12 of the semiconductor element 20 is different from a volume ratio of the N+ diffusion region 12a and the P+ diffusion region 12b in the second region portion 12 of another semiconductor element 30. The ratios (W1:W2) in these semiconductor elements 20 and 30 are different from the ratio (W1:W2) of the width W1 of each of the N+ diffusion regions 12a and the width W2 of each of the P+ diffusion regions 12b in the second region portion 12 of the semiconductor element 60. Thus, the volume ratios of the N+ diffusion region 12a and the P+ diffusion region 12b in the second region portions 12 of the semiconductor elements 20 and 30 are different from a volume ratio of the N+ diffusion region 12a and the P+ diffusion region 12b in the second region portion 12 of the semiconductor element 60.

In this manner, in the same semiconductor substrate 2, the plural types of the semiconductor elements 20, 30, and 60 having different characteristics from each other are disposed by using a method other than a change of at least the source-drain pitch. In each element, the degree of the tolerance or the reduction degree of the ON-resistance can be set and thus the elements can be individually used with the high degree of freedom.

In the example of FIG. 1, the bipolar transistor 71, the resistive element 72, the memory 73, the capacitor 74, and the CMOS 75 are mixed and mounted along the semiconductor elements 20, 30, and 60. One or plural types of semiconductor elements 40, 50, 80, and 90 (which will be described later) may be mixed and mounted along these components. In this manner, the semiconductor device 1 can be intended to have multi-function by mixing and mounting multiple types of components, and the size of the device can be reduced in comparison to a case where the equivalent function is implemented by multiple components.

An example of advantages obtained in the semiconductor device 1 will be described.

In this configuration, the plural types of the semiconductor structure portions 13 (structure portion 13a, 13b, and 13c) are provided in each of the second region portions 12 formed in the plurality of semiconductor elements 20, 30, and 60 in the semiconductor device 1. In the device, the plural types of the semiconductor structure portions 13 in which the ratios of the N+ diffusion regions 12a and the diffusion regions 12b are different from each other are present. The ratio of the N+ diffusion regions 12a and the P+ diffusion regions 12b in the semiconductor structure portion 13 is a factor which has an influence on channel resistance and a factor which contributes to setting of tolerance and ON-resistance. A structure which can cause a difference in channel resistance to occur and causes the tolerance to be increased more, or a structure which causes the ON-resistance to be reduced more can be obtained by changing the ratio. Accordingly, if the percentage of the N-conductive type and the percentage of the P-conductive type in the semiconductor structure portion 13 are not determined uniformly, but are set individually for each region, balance of the tolerance and the ON-resistance in each region in a state appropriate for each region can be determined. In addition, in a region in which the tolerance is relatively regarded as important, a gap between the first region portion 11 and the second region portion 12 is not increased much and a ratio in the second region portion 12 is adjusted. Thus, the tolerance can be increased. Accordingly, loss in area is effectively suppressed.

For example, since the percentage of the first conductivity type semiconductor regions (N+ diffusion regions 12a) and the percentage of the second conductivity type semiconductor regions (P+ diffusion regions 12b) are different from each other in the second region portion 12 in the semiconductor elements 20 and 30, an effect of increasing the tolerance or an effect of reducing the ON-resistance is more higher than that in the configuration in which these ratios are substantially the same. For example, in the semiconductor element 20, the ESD tolerance becomes higher, and the L-load tolerance becomes higher by using a method individual from a method of changing the pitch L1 between the source and the drain. Thus, an effect of increasing the tolerance with suppression of the loss in area is obtained. Conversely, in the semiconductor element 30, the ON-resistance is reduced, and particularly, the ON-resistance is reduced with reduction of the OFF-withstand voltage by using a method individual from a method of changing the pitch L1 between the source and the drain.

Figure 5:
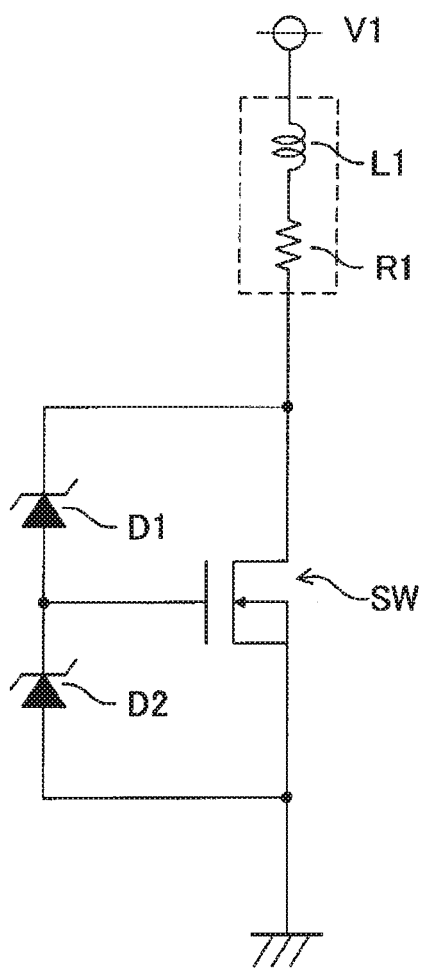
FIG. 5 is a circuit diagram illustrating a test circuit for an L-load tolerance test.
Figure 6:
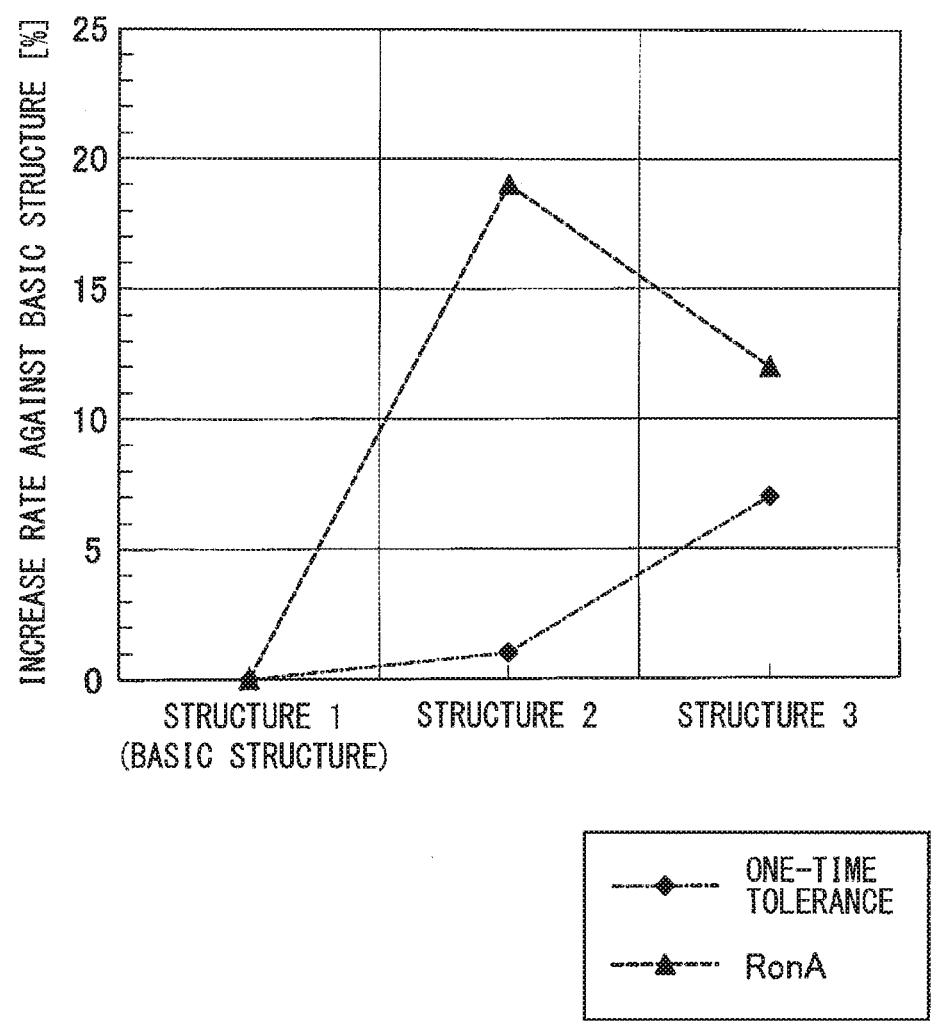
FIG. 6 is a graph illustrating a test result and the like of the L-load tolerance test (one-time tolerance test) for the semiconductor element in FIG. 2 and a comparison element.

Here, a result of a tolerance test using a circuit illustrated in FIG. 5, which is performed for the semiconductor device 1 will be described. FIG. 6 is a result of a one-time tolerance test using the circuit in FIG. 5. In this one-time tolerance test, for example, basic setting is as follows. A power supply voltage of a power supply V1 is set to 16 V, inductance of a coil L1 is set to 15 mH, a resistance value of a resistor R1 is set to 10Ω, a Zener voltage of a Zener diode D1 is set to 40 V, and a Zener voltage of a Zener diode D2 is set to 10 V. It is examined whether or not avalanche breakdown occurs when an element which is a test target performs a switching operation, by applying a single pulse having a predetermined pulse width (for example, a pulse interval of several hundred μs) to a gate of the element (semiconductor element SW in FIG. 5) which is a test target. Regarding this test, the above test is performed under plural energy conditions and energy when avalanche breakdown occurs at the single pulse is examined.

In FIG. 6, the structure of the semiconductor element 60 illustrated in FIG. 4C is set to be Structure 1 and Structure 1 is set as a reference structure (comparative example). Structure 1 is the same as that of the semiconductor element 20 illustrated in FIGS. 2, 3A, and 3B except for a configuration of the second region portion 12. In the semiconductor element 60 having Structure 1, the ratio (W1:W2) of the width W1 of the N+ diffusion region and the width W2 of the P+ diffusion region in the second region portion 12 satisfies 1:1 and the volume ratio of these regions satisfies 1:1. Structure 2 illustrated in FIG. 6 is the same as Structure 1 (semiconductor element 60) except for a configuration in which the source-drain gap L1 is widened to an extent of obtaining characteristics in FIG. 6, compared to the configuration of Structure 1 (semiconductor element 60). Structure 3 corresponds to the structure of the semiconductor element 20 illustrated in FIGS. 2, 3A, and 3B. In Structure 3, the ratio (W1:W2) of the width W1 of the N+ diffusion region and the width W2 of the P+ diffusion region in the second region portion 12 satisfies 1:2. Structure 3 is the same as Structure 1 except for an inner structure of the second region portion 12.

In FIG. 6, each of the structures (Structures 1, 2, and 3) are represented in a transverse axis and a rising rate obtained by performing comparison to a value in the reference structure is represented in a vertical axis. Regarding the rising rate in the vertical axis, a rising rate when one-time tolerance (unit: mJ/mm$^2$) in each of the structures is compared to one-time tolerance in the reference structure, that is, how much one-time tolerance is increased in comparison to the one-time tolerance in the reference structure, is indicated by black quadrangular marks in a case of the one-time tolerance. In a case of the ON-resistance, a rising rate when ON-resistance in each of the structures is compared to ON-resistance in the reference structure, that is, how much ON-resistance is increased in comparison to the ON-resistance in the reference structure, is indicated by black triangular marks. The one-time tolerance in each of Structures 1, 2, and 3 corresponds to tolerance examined by using the element in the structure as the switching element SW in FIG. 5 and applying a one-time pulse to the gate in the one-time tolerance test (energy when avalanche breakdown occurs at a single pulse).

According to the result in FIG. 6, in Structure 2 in which the tolerance may be improved by increasing the source-drain gap L1, it can be confirmed that the rising rate of the tolerance is higher than that in Structure 1 by about 1%, and thus the rising rate of the ON-resistance is higher than that in Structure 1 by about 19%. In Structure 3 (semiconductor element 20) in which the percentage of the P+ diffusion region is greater than the percentage of the N+ diffusion region in the second region portion 12, it can be confirmed that the rising rate of the ON-resistance is suppressed to be low, as low as about 12%, even though the rising rate of the tolerance is higher than that in Structure 1 by about 7%. In this manner, if the percentage of the P+ diffusion region is greater than the percentage of the N+ diffusion region in the second region portion 12, the degree of increasing the ON-resistance with an increase of the tolerance becomes smaller. Accordingly, the tolerance can be effectively improved with suppression of the ON-resistance.

Figure 7:
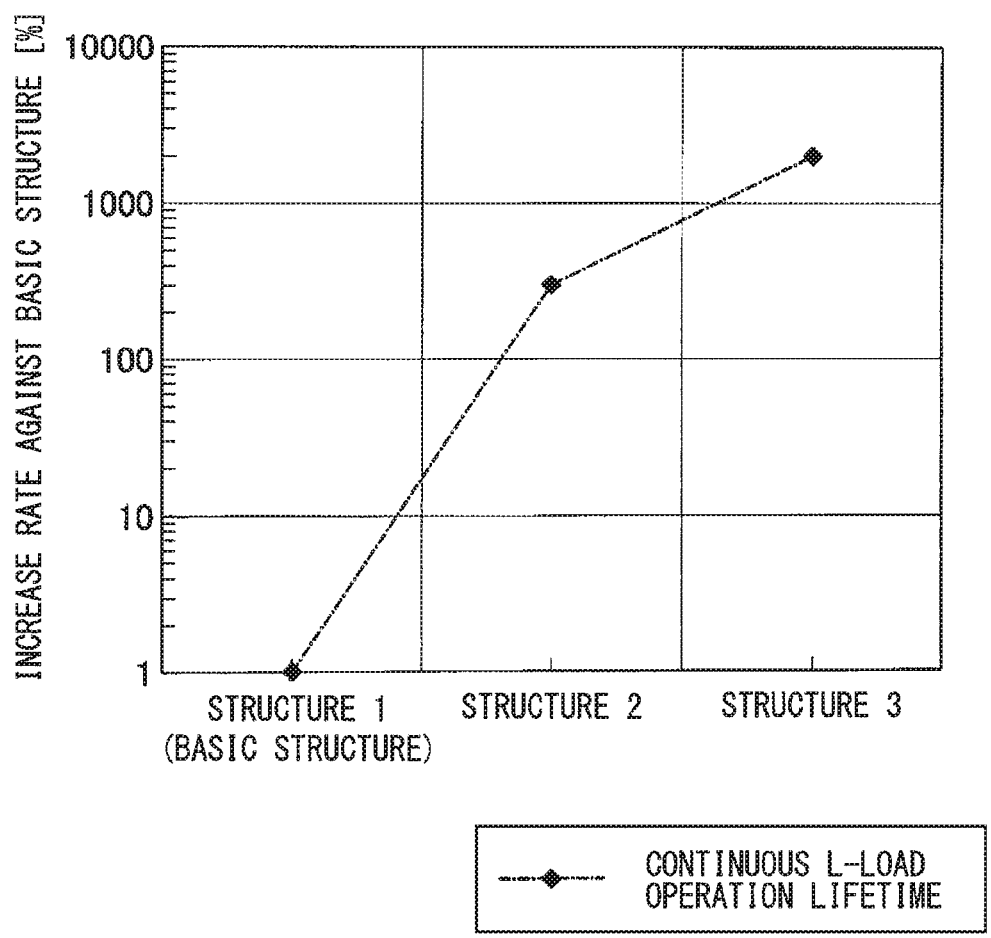
FIG. 7 is a graph illustrating a test result and the like of the L-load tolerance test (continuous operation lifetime test) for the semiconductor element in FIG. 2 and a comparison element.

FIG. 7 illustrates a test result for a continuous L-load operation lifetime. In this test, the test circuit in FIG. 5 is also used and basic setting is also as follows. For example, the power supply voltage of the power supply V1 is set to 16 V, the inductance of the coil L1 is set to 15 mH, the resistance value of the resistor R1 is set to 10Ω, the Zener voltage of the Zener diode D1 is set to 40 V, and the Zener voltage of the Zener diode D2 is set to 10 V. The test result indicates the lifetime (the number of performing switching until avalanche breakdown occurs) when an element which is a test target performs a switching operation, by applying a pulse at a cycle of 200 Hz to a gate of the element (semiconductor element SW in FIG. 5) which is a test target. Regarding this test, the switching operation is repeatedly performed with energy (10.1 mJ) which is significantly lower than energy when avalanche breakdown occurs at the single pulse. Structure 1, Structure 2, and Structure 3 are the same as the structure described in the above one-time tolerance test (FIG. 6).

A graph in FIG. 7 illustrates a lifetime of each of Structures 1, 2, and 3 when a lifetime (the number of performing switching until avalanche breakdown occurs) is set to "1" in a case of Structure 1, as a relative value. As illustrated in FIG. 7, in Structure 2 in which the tolerance may be improved by increasing the source-drain gap L1, the lifetime is longer than the lifetime in Structure 1 by several hundred % On the contrary, in Structure 3 (semiconductor element 20) in which the percentage of the P+ diffusion region is greater than the percentage of the N+ diffusion region in the second region portion 12, the lifetime is longer than the lifetime in Structure 1 by several thousand %. In this manner, it can be confirmed that the continuous L-load operation lifetime of the semiconductor element 20 of Structure 3 is significantly longer than that of the element of Structure 2.

Next, the ON-resistance and the like in each of the semiconductor element 20 (Structure 3), the semiconductor element 30 (Structure 4), and the semiconductor element 60 (Structure 1) will be described. The Structures 1 and 3 illustrated herein are the same as Structures 1 and 3 described in the above one-time tolerance test (FIG. 6). Structure 4 is the structure of the semiconductor element 30 illustrated in FIG. 4B, and the like. In Structure 4, the ratio (W1:W2) of the width W1 of the N+ diffusion region and the width W2 of the P+ diffusion region in the second region portion 12 satisfies 2:1. Structure 4 is the same as Structures 1 and 3 except for an inner structure of the second region portion 12.

Figure 8:
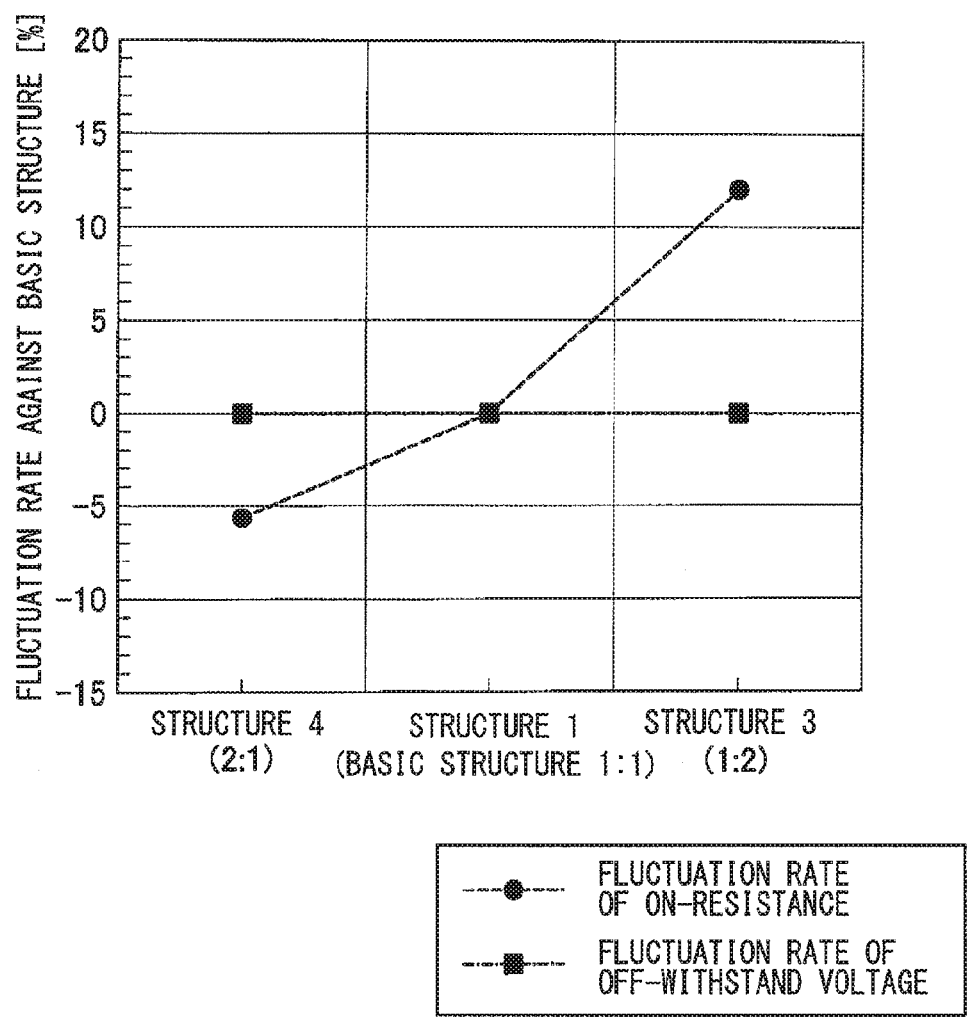
FIG. 8 is a graph illustrating a result obtained by comparing ON-resistance and an OFF-withstand voltage in each of the semiconductor elements illustrated in FIGS. 4A and 4B to ON-resistance and an OFF-withstand voltage in the semiconductor element illustrated in FIG. 4C.

In FIG. 8, the semiconductor element 60 (Structure 1) is used as the reference structure, and a fluctuation rate obtained by comparing the ON-resistance in the structure (unit: mΩ*mm$^2$) to the ON-resistance in the reference structure is indicated by a black circle. A fluctuation rate when an OFF-withstand voltage in the structure is compared to an OFF-withstand voltage in the reference structure is indicated by black quadrangles. As illustrated in FIG. 8, in the structure (Structure 4) of the semiconductor element 30, the ON-resistance is reduced by about 6% in comparison to the ON-resistance in the reference structure. However, the OFF-withstand voltage is substantially the same as that in the structure (Structure 1) of the semiconductor element 60. In the structure (Structure 3) of the semiconductor element 20, the ON-resistance is increased by about 12% in comparison to the ON-resistance in the reference structure. However, as described above, the tolerance and the lifetime can be significantly increased in this configuration (FIGS. 6 and 7). In the structure (Structure 3) of the semiconductor element 20, the OFF-withstand voltage is substantially the same as that in the structure (Structure 1) of the semiconductor element 60.

Second Embodiment

Next, a second embodiment will be described.

Figure 9A:
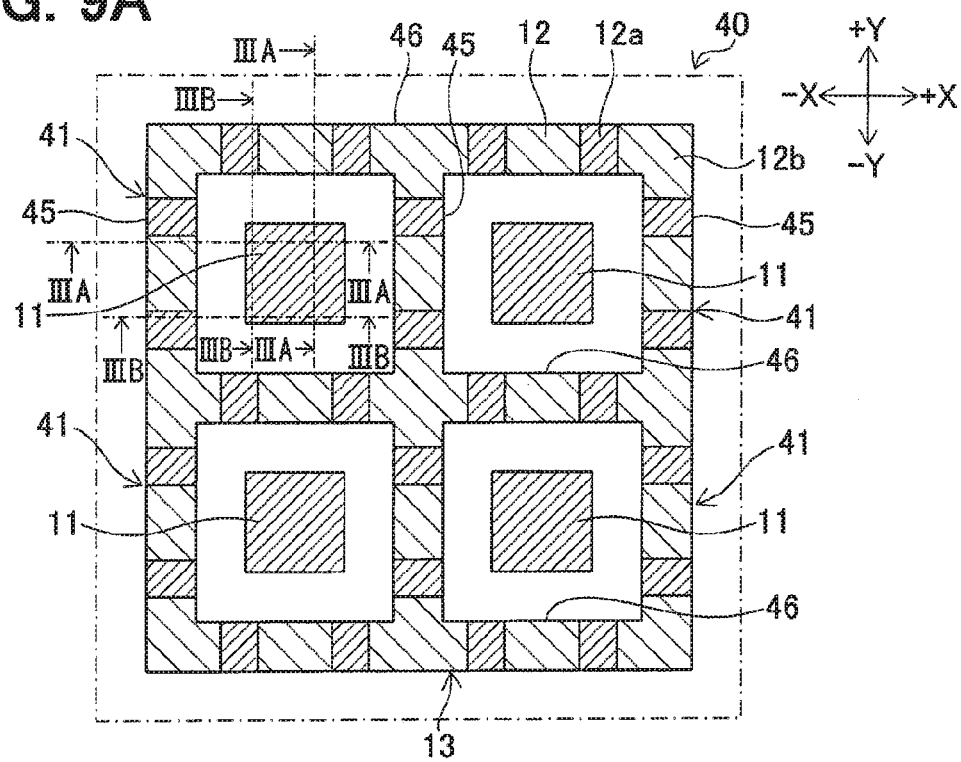
FIG. 9A is a diagram partially illustrating a planar configuration of a first region portion, a second region portion, a gate region, and the like in a semiconductor element constituting a semiconductor device according to a second embodiment.

The second embodiment is different from the first embodiment in that any one semiconductor element or plural semiconductor elements is formed as a semiconductor element having a mesh structure as illustrated in FIG. 9A in the semiconductor device 1 illustrated in FIG. 1. Otherwise, the second embodiment is the same as the semiconductor device 1 according to the first embodiment.

A semiconductor element 40 illustrated in FIG. 9A is formed as an LDMOS transistor of a so-called mesh structure. This semiconductor element 40 has a lattice-like structure in which second region portions 12 functioning as a source region are extended in a vertical direction and a transverse direction. FIG. 9A partially illustrates a portion of the semiconductor element 40. However, in practice, the number of longitudinal regions 45 and transverse regions 46 constituting the second region portion 12 is greater than in the configuration of FIG. 9A. In FIG. 9A, a gate electrode and the like is omitted.

The semiconductor element 40 illustrated in FIG. 9A has a structure in which plural partial structures 41 are arranged. In each of the plural partial structures 41, a rectangular first region portion 11 in a plan view is disposed at a predetermined central portion and the second region portions 12 are disposed so as to surround the first region portion 11 at positions separated from the first region portion 11. FIG. 9A illustrates only the partial structure 41 of a portion having a disposition of 2 columns X2 rows. However, in practice, a partial structure 41 of multiple columns of three or more columns and multiple rows of three or more rows is disposed. In the semiconductor element 40, a section at a position of IIIA-IIIA in FIG. 9A has the same structure as that in FIG. 3A. A section at a position of IIIB-IIIB in FIG. 9A has the same structure as that in FIG. 3B. The basic switching operation and the basic function are the same as those in a known LDMOS transistor of a mesh structure.

In the semiconductor element 40 illustrated in FIG. 9A, the second region portion 12 includes the longitudinal region 45, and the transverse region 46. The longitudinal region 45 is extended in a predetermined vertical direction (Y direction) so as to have a longitudinal shape. The transverse region 46 is extended in a transverse direction (X direction) orthogonal to the vertical direction so as to have a longitudinal shape. The first region portion 11 is provided in each region surrounded by the longitudinal region 45 and the transverse region 46. The first region portion 11 is formed at a position separated from the longitudinal region 45 and the transverse region 46 with a predetermined distance in the vicinity of the center position of the region partitioned by the longitudinal region 45 and the transverse region 46. The first region portion 11 is formed as an N-conductive type diffusion region (N+ diffusion region) which is formed with a concentration higher than that of a semiconductor substrate 2, and functions as a drain region which is electrically connected to a drain electrode (not illustrated) (also see FIGS. 3A and 3B).

In this configuration, a predetermined one direction of planar directions parallel with the surface of the semiconductor substrate 2 is also set as an X direction, and a direction of the planar directions orthogonal to the X direction is also set as a Y direction. The X direction corresponds to the transverse direction and plural transverse regions 46 are extended in the X direction so as to have a longitudinal shape. The Y direction corresponds to the vertical direction and plural longitudinal regions 45 are extended in the Y direction so as to have a longitudinal shape. In this configuration, an N-conductive type (N-type) is set as a first conductivity type and a P-conductive type is set as a second conductivity type. Similarly to in FIGS. 3A and 3B, a region between the first region portion 11 and the second region portion 12 in the semiconductor substrate 2 functions as a channel region. A gate electrode 14 is disposed over the region with an insulating film 16 interposed between the region and the gate electrode 14.

Regarding the second region portion 12 (source region) of the semiconductor element 40, an N+ diffusion region 12a and a P+ diffusion region 12h are alternately disposed in the longitudinal region 45 extended in the vertical direction. The N+ diffusion region 12a and the P+ diffusion region 12b are also alternately disposed in the transverse region 46 extended in the transverse direction. In any of the longitudinal region 45 and the transverse region 46, a percentage of the N+ diffusion region 12a and a percentage of the P+ diffusion region 12b are different from each other. In all of the second region portions 12, the percentage of the N+ diffusion region 12a and the percentage of the P+ diffusion region 12b are different from each other.

Specifically, in the second region portion 12, a ratio of the volume of the P+ diffusion region 12b (P+ active portion) to the total volume of the second region portion 12 is greater than a ratio of the volume of the N+ diffusion region 12a (N+ active portion) to the total volume of the second region portion 12. That is, in the second region portion 12, the P+ diffusion regions 12b are disposed so as to be greater than the N+ diffusion regions 12a. In the example of FIG. 9A, the volume of the P+ diffusion region 12b is set to be substantially twice the volume of the N+ diffusion region 12a in the second region portion.

More specifically, in the longitudinal region 45 extended in the vertical direction, a width W11 of the N+ diffusion region 12a in the vertical direction (length in the vertical direction) is different from a width W12 of the P+ diffusion region 12b in the vertical direction (length in the vertical direction). For example, the width W12 of the P+ diffusion region 12b in the vertical direction is substantially twice the width W11 of the N+ diffusion region 12a in the vertical direction. In the transverse region 46, a width W21 of the N+ diffusion region 12a in the transverse direction (length in the transverse direction) is different from a width W22 of the P+ diffusion region 12b in the transverse direction (length in the transverse direction). The width W22 of the P+ diffusion region 12b in the transverse direction is substantially twice the width W21 of the N+ diffusion region 12a in the transverse direction. The depth of the N+ diffusion region 12a is substantially the same as the depth of the P+ diffusion region 12b, for example. The width W11 of the N+ diffusion region 12a in the vertical direction (length in the vertical direction) in the longitudinal region 45 is substantially the same as the width W21 of the N+ diffusion region 12a in the transverse direction (length in the transverse direction) in the transverse region 46, for example. The width W12 of the P+ diffusion region 12b in the vertical direction (length in the vertical direction) in the longitudinal region 45 is substantially the same as the width W22 of the P+ diffusion region 12b in the transverse direction (length in the transverse direction) in the transverse region 46, for example. With such a configuration, the volume of the P+ diffusion region 12b is substantially twice the volume of the N+ diffusion region 12a in the second region portion. Thus, similarly to in the semiconductor element 20 according to the first embodiment, ESD tolerance becomes high and L-load tolerance becomes high.

In this semiconductor element 40, for example, all of the second region portions 12 formed so as to have a lattice shape are also configured by the same type of semiconductor structure portions 13 (semiconductor structure portions 13 having a type illustrated in FIG. 9A). In the semiconductor structure portion 13, all upper surface areas of the P+ diffusion regions 12b are greater than an upper surface area of the N+ diffusion region 12a. For example, the upper surface area of one P+ diffusion region 12b is substantially twice the upper surface area of one N+ diffusion region 12a. With such a configuration, in an upper surface of the second region portion 12 formed so as to have a lattice shape, a ratio of an area (area of the upper surface) of the N+ diffusion region 12a and an area (area of the upper surface) of the P+ diffusion region 12b does not satisfy 1:1, and the total area of the upper surfaces of the P+ diffusion regions 12b is greater than (for example, substantially twice) the total area of the upper surfaces of the N+ diffusion regions 12a.

Regarding the semiconductor structure portion 13, a ratio of the sum of lengths of the N+ diffusion regions 12a and the sum of lengths of the P+ diffusion regions 12b at a boundary portion of the first region portion 11 side does not satisfy 1:1 on the upper surface of the semiconductor structure portion 13. The sum of the lengths of the P+ diffusion regions 12b at the boundary portion is greater than (for example, substantially twice) the sum of the lengths of the N+ diffusion regions 12a at the boundary portion. In the example of FIG. 9A, in each of the partial structures 41, an inner circumference portion (inner circumference portion of a rectangular shape) of the first region portion 11 side in the second region portion 12 corresponds to the "boundary portion of the first region portion 11 side in the semiconductor structure portion 13". The sum of boundary lengths of the P+ diffusion regions 12b is greater than (for example, substantially twice) the sum of boundary lengths of the N+ diffusion regions 12a, at the boundary portion of any of the partial structures 41. Accordingly, regarding the entirety of the semiconductor element 40, the sum of the boundary lengths of the P+ diffusion region 12b is greater than the sum of the boundary lengths of the N+ diffusion region 12a at all of boundary portions of the first region portion 11 side on the upper surface of the semiconductor structure portion 13.

In this manner, when one or plural semiconductor elements which is formed in the semiconductor substrate 2 is used as the semiconductor element 40 of the mesh structure, plural types of the semiconductor structure portions 13 in which ratios of the P+ diffusion region 12b and the N+ diffusion region 12a are different from each other can be also provided in the second region portion 12 disposed in a single element or plural elements. In this case, plural types of the semiconductor structure portions 13 in which ratios of the upper surface area of the N+ diffusion region 12a and the upper surface area of the P+ diffusion region 12b are different from each other and ratios of the sum of the lengths of the N+ diffusion region 12a and the sum of the lengths of the P+ diffusion region 12b at the boundary portion of the first region portion 11 side on the upper surface are different from each other may be also provided.

In the configuration including the semiconductor element 40 of the mesh structure, when the plural types of the semiconductor structure portions 13 are provided, the semiconductor element 40 as illustrated in FIG. 9A may be used as any element in the semiconductor device 1, and one or plural semiconductor element 40 having the mesh structure as illustrated in FIG. 9A or one or plural semiconductor elements 20, 30, and 60 as described in the first embodiment may be provided as other elements. Ratios of the N+ diffusion region 12a and the P+ diffusion region 12b in the semiconductor structure portion 13 may be different from each other in plural elements mounted in the semiconductor device 1. For example, in the semiconductor device 1, the semiconductor element 40 as illustrated in FIG. 9A may be provided as one element and a semiconductor element having a mesh structure (semiconductor element having a structure which is similar to in FIG. 9A and in which the ratio is different) in which the ratio of the N+ diffusion region 12a and the P+ diffusion region 12b satisfies 1:1 may be provided as other elements. In addition, a semiconductor element having a mesh structure (semiconductor element having a structure which is similar to in FIG. 9A and in which the ratio is different) in which the ratio of the diffusion region 12a and the P+ diffusion region 12b satisfies 2:1 may be provided as other elements. In addition, plural types of the semiconductor structure portions 13 in which ratios of the N+ diffusion region 12a and the P+ diffusion region 12b are different from each other may be provided in the inside of one semiconductor element 40 of the mesh structure. In addition, a structure obtained by combining these structures may be used.

Figure 9B:
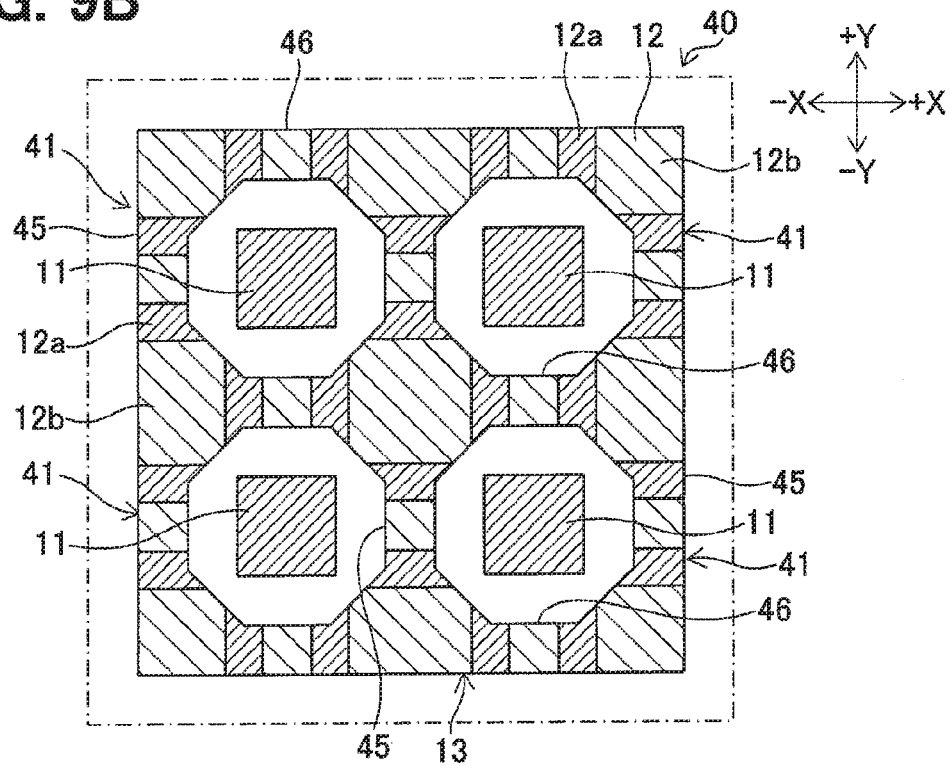
FIG. 9B is a diagram illustrating a modification example of the semiconductor element in FIG. 9A.

The configuration of the semiconductor element 40 of the mesh structure is not limited to the configuration in FIG. 9A, and the shape of the first region portion 11 or the second region portion 12 may be variously changed. For example, the shape of the second region portion 12 may be changed as illustrated in FIG. 9B. In the example of FIG. 9B, a shape of an inner circumferential portion or a disposition configuration of the N+ diffusion regions 12a and the P+ diffusion region 12b is different from that in the example of FIG. 9A, in each region (each region in which the first region portion 11 is disposed at the center) partitioned by the second region portion 12.

Third Embodiment

Next, a third embodiment will be described.

Figure 10:
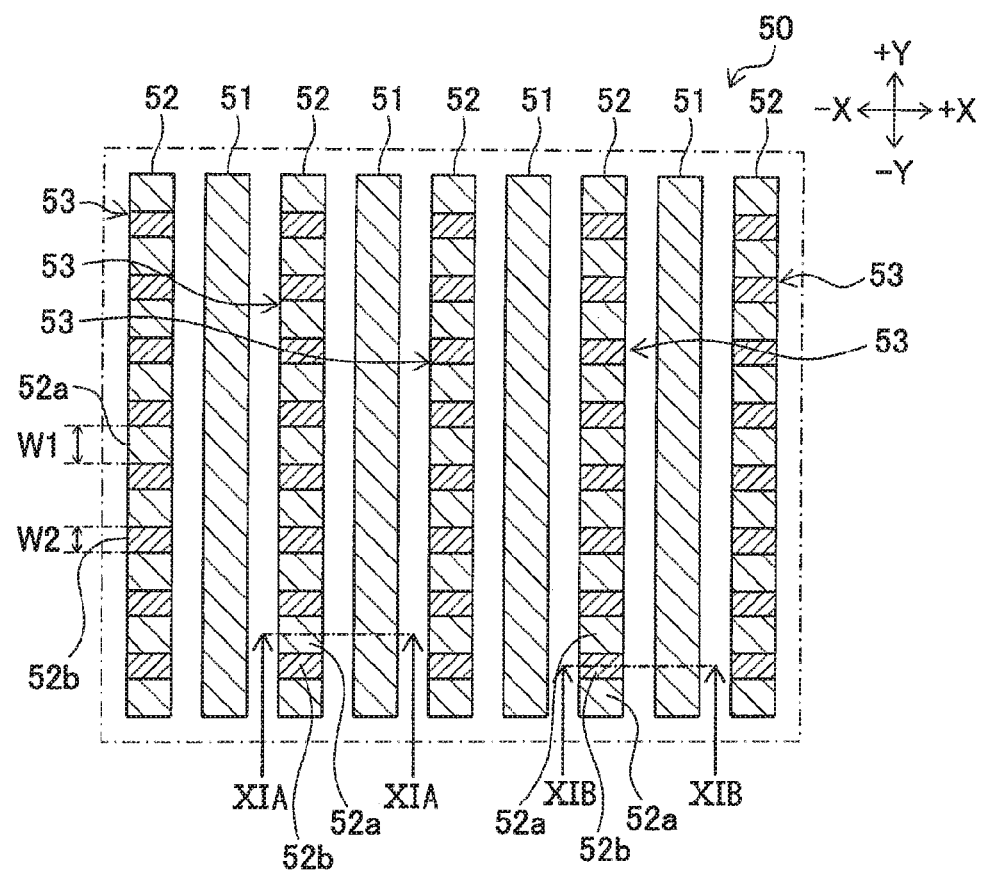
FIG. 10 is a schematic diagram schematically illustrating a planar configuration of a surface side of a semiconductor element constituting a semiconductor device according to a third embodiment.

A semiconductor element 50 illustrated in FIG. 10 is formed as a horizontal IGBT. In the semiconductor element 50, a first region portion 51 and a second region portion 52 are alternately formed in a surface layer portion of an N-type semiconductor substrate 2. The first region portion 51 is a region corresponding to a collector of the IGBT and the second region portion 52 is a region corresponding to an emitter of the IGBT. The third embodiment is different from the first embodiment in that any one semiconductor element or plural semiconductor elements are formed as the semiconductor element 50 as illustrated in FIG. 10 in the semiconductor device 1 according to the first embodiment. Otherwise, the third embodiment is the same as the semiconductor device 1 according to the first embodiment.

Figure 11A:
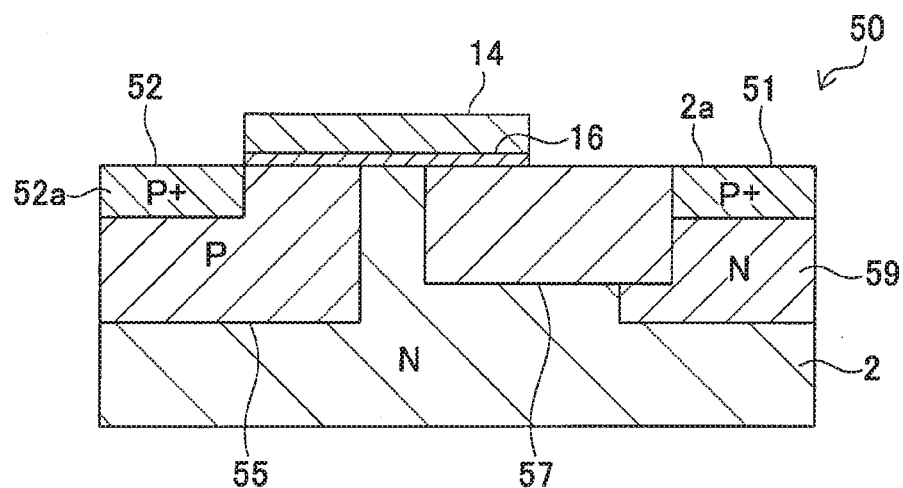
FIG. 11A is a schematic sectional diagram schematically illustrating a sectional configuration at a position of XIA-XIA in the semiconductor element of FIG. 10.
Figure 11B:
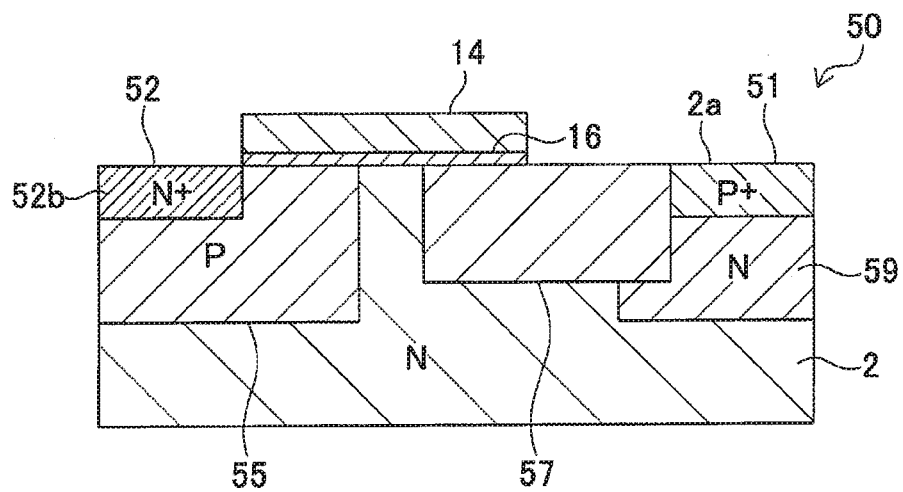
FIG. 11B is a schematic sectional diagram schematically illustrating a sectional configuration at a position of XIB-XIB in the semiconductor element of FIG. 10.

As illustrated in FIGS. 10, 11A, and 11B, the first region portion 51 is formed as a P-conductive type semiconductor region which is extended in a predetermined direction on a surface 2a side of the semiconductor substrate 2 so as to have a longitudinal shape. In this configuration, a predetermined one direction of planar directions parallel with the surface of the semiconductor substrate 2 is also set as an X direction, and a direction of the planar directions orthogonal to the X direction is also set as a Y direction. The Y direction corresponds to the predetermined direction. Plural first region portions 51 are extended in the Y direction so as to have a longitudinal shape. In this configuration, a P-conductive type (P-type) is set as a first conductivity type and an N-conductive type is set as a second conductivity type. The first region portion 51 is formed as a P-conductive type diffusion region (P+ diffusion region) and functions as a collector region which is electrically connected to a collector electrode (not illustrated).

As illustrated in FIG. 11, an insulating film 57 is formed at a position adjacent to each of the first region portions 51 in the vicinity of the surface of the semiconductor substrate 2. The insulating film 57 is formed of SiO2, for example. As shown in FIG. 11, the insulating film 57 is formed so as to have one end side which is adjacent to the first region portion 51 (P+ diffusion region) in the transverse direction (X direction) and the other end side which is disposed at a position under a gate electrode 14 which is the same as that in the first embodiment, in the vicinity of the surface layer portion on the surface 2a side of the semiconductor substrate 2. Thus, the insulating film 57 is extended in the Y direction so as to have a longitudinal shape along the first region portion 51 with being adjacent to the first region portion 51. An N-conductive type buffer region 59 is provided under the first region portion 51.

The second region portion 52 is formed on the surface 2a side of the semiconductor substrate 2, as a region which is extended in the predetermined direction (Y direction) so as to have a longitudinal shape. In this configuration, plural second region portions 52 are extended at a gap in the Y direction so as to have a longitudinal shape. Each of the second region portions 52 is disposed at a position separated from the first region portions 51 between the plurality of first region portions 51 which are arranged along the X direction (between the first region portions 51 which are adjacent to each other). In a semiconductor structure portion 53 constituting the second region portion 52, a P-conductive type diffusion region (P+ diffusion region 52a) and an N-conductive type diffusion region (N+ diffusion region 52b) are alternately provided in the Y direction. The semiconductor structure portion 53 functions as an emitter region which is electrically connected to an emitter electrode (not illustrated). More detailed configuration of the second region portion 52 will be described later.

As illustrated in FIGS. 11A and 11B, a P-conductive type body region 55 is formed around the second region portion 52 formed at the surface layer portion of the semiconductor substrate 2. A portion of the body region 55 on the surface layer portion which is adjacent to the second region portion 52 functions as a channel region.

As illustrated in FIGS. 11A and 11B, the gate electrode 14 is disposed over a region between the first region portion 51 and the second region portion 52 in the semiconductor substrate 2, with an insulating film 16 interposed between the region and the gate electrode 14. The insulating film 16 and the gate electrode 14 are formed across the body region 55, a region of the semiconductor substrate 2 between the body region 55 and the insulating film 57, and a portion of the insulating film 57. The insulating film 16 and the gate electrode 14 are disposed over these components and are extended in a direction (that is, Y direction) in which the first region portion 51 and the second region portion 52 are extended, so as to have a longitudinal shape. In FIG. 10, the gate electrode 14 and the like is omitted. In the example of FIGS. 11A, 11B, and the like, a configuration (insulating film, wiring, or the like) on an upper part side of the semiconductor substrate 2 or the gate electrode 14 is omitted.

In this configuration, a percentage of the P+ diffusion region 52a and a percentage of the N+ diffusion region 52b are also different from each other in the second region portion 52. Specifically, in the second region portion 52, a width W1 of the P+ diffusion region 52a is different from a width W2 of the N+ diffusion region 52b. For example, the width W1 is substantially twice the width W2. In this example of FIG. 10, the percentage of the P+ diffusion region 52a is greater than the percentage of the N+ diffusion region 52b in the second region portion 52. Conversely, a configuration in which the width W2 of the N+ diffusion region 52b is greater than the width W1 of the P+ diffusion region 52a may be made. In addition, in the second region portion 52, the percentage of the N+ diffusion region 52b may be greater than the percentage of the P+ diffusion region 52a.

In this manner, when one or plural semiconductor elements which is formed in the semiconductor substrate 2 is used as an IGBT, plural types of the semiconductor structure portions in which ratios of the P+ diffusion region and the N+ diffusion region are different from each other can be also provided in the second region portion disposed in a single element or plural elements. In this case, in the semiconductor device, plural types of the semiconductor structure portions in which ratios of upper surface area of the N+ diffusion region and upper surface area of the P+ diffusion region are different from each other and ratios of the sum of lengths of the N+ diffusion region and the sum of lengths of the P+ diffusion region at the boundary portion of the first region portion side on the upper surface are different from each other may be also provided. For example, when plural semiconductor elements 50 as illustrated in FIG. 10 are provided in the semiconductor device 1, ratios of the P+ diffusion region and the N+ diffusion region (specifically, ratio of the upper surface area of the N+ diffusion region and the upper surface area of the P+ diffusion region) may be different from each other in the semiconductor structure portions 53 of the elements. In addition, plural types of the semiconductor structure portions 53 in which ratios of the N+ diffusion region 12a and the P+ diffusion region 12b are different from each other may be provided in one semiconductor element 50.

Fourth Embodiment

Next, a fourth embodiment will be described with reference to FIG. 12 and the like.

The fourth embodiment is different from semiconductor device 1 according to the first embodiment in that any semiconductor element (for example, one of plural semiconductor elements 30) is substituted with a semiconductor element 80 in the semiconductor device 1 illustrated in FIG. 1. Otherwise, the fourth embodiment is the same as the semiconductor device 1 according to the first embodiment. FIG. 12 schematically illustrates a planar configuration of a surface side of the semiconductor element 80. In FIG. 12, a second region portion 12 is indicated as a hatching region, and a first region portion 11 is indicated as a form different from that for the second region portion. FIG. 12 schematically illustrates the second region portion 12. In practice, the second region portion 12 has a configuration in which a P+ diffusion region and an N+ diffusion region are alternately disposed in a predetermined direction (direction in which the second region portion 12 is extended).

In the semiconductor device 1 having this configuration, plural semiconductor elements such as the semiconductor element 80 are formed on a predetermined surface 2a side of a semiconductor substrate 2. The semiconductor element 80 has the same basic structure as those in the above-described semiconductor elements 20, 30, and 60, and only a shape of each of an N+ diffusion region 12a and a P+ diffusion region 12b in the second region portion 12 is different from that in the semiconductor elements 20, 30, and 60. In this semiconductor element 80, a sectional structure of the second region portion 12 in the vicinity of the P+ diffusion region 12b (sectional structure obtained by cutting the second region portion 12 at a position of the P+ diffusion region 12b in the direction in which the second region portion 12 is extended) is the same as that in FIG. 3A. A sectional structure of the second region portion 12 in the vicinity of the N+ diffusion region 12a (sectional structure obtained by cutting the second region portion 12 at a position of the N+ diffusion region 12a in the direction orthogonal to the direction in which the second region portion 12 is extended) is the same as that in FIG. 3B. As illustrated in FIG. 12, the semiconductor element 80 includes the first region portions 11 and the second region portions 12 in the surface 2a side of the semiconductor substrate 2. Similarly to in FIGS. 2, 3A, and 3B, the first region portion 11 is a portion having an N+ diffusion region formed so as to have a longitudinal shape. Similarly to in FIG. 2, the second region portion 12 is a portion in which a semiconductor structure portion 13 in which the N+ diffusion region 12a and the P+ diffusion region 12b are alternately formed at a position separated from the first region portion 11 is disposed. Similarly to in FIGS. 3A and 3B, a gate electrode 14 is disposed over a region between the first region portion 11 and the second region portion 12 in the semiconductor substrate 2, with an insulating film 16 interposed between the region and the gate electrode 14.

In the semiconductor device 1 having this configuration (for example, configuration in which any element in FIG. 1 is substituted with the semiconductor element 80 in FIG. 12), plural types of the semiconductor structure portions 13 in which ratios of the N+ diffusion region 12a and the P+ diffusion region 12b are different from each other are provided in the second region portion 12. In this configuration, the plural types of the semiconductor structure portions 13 are provided in the single semiconductor element 80.

Figure 12:
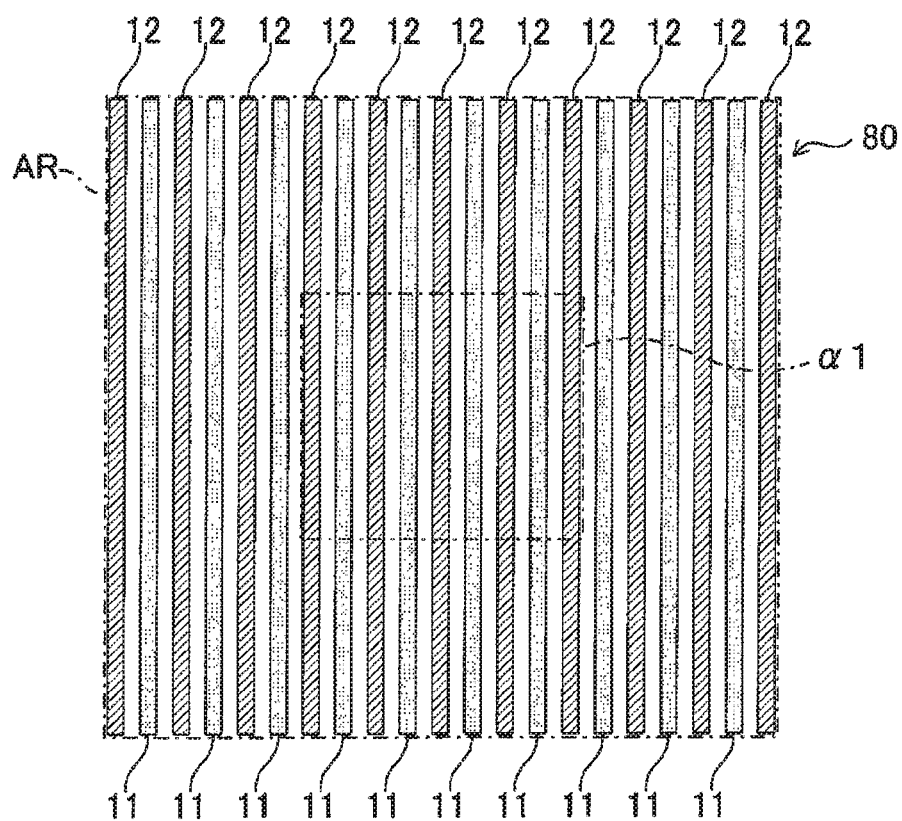
FIG. 12 is a schematic diagram schematically illustrating a planar configuration of a surface side of a semiconductor element constituting a semiconductor device according to a fourth embodiment.

As illustrated in FIG. 12, in the semiconductor element 80, a first type semiconductor structure portion 13 (for example, structure portion 13a illustrated in FIG. 4A) is provided in a predetermined central region (specifically, a region of a dashed line α1 illustrated in FIG. 12) separated from an element circumferential portion (in the example of FIG. 12, a rectangular circumference portion constituting a boundary of an element region AR of the semiconductor element 80) of the semiconductor element 80. In the first type semiconductor structure portion 13, the ratio of the N+ diffusion region 12a and the P+ diffusion region 12b is set to a predetermined first ratio. In the semiconductor element 80, a semiconductor structure portion 13 (for example, structure portion 13b illustrated in FIG. 4B) is provided on an element circumferential portion side (specifically, portion which is out of the region of the dashed line α1 and is in the element region AR) of the first type semiconductor structure portion 13 formed at the center region (region of the dashed line α1). The semiconductor structure portion 13 has a type different from the first type and has a structure in which the percentage of the N+ diffusion region 12a is greater than that in the first type semiconductor structure portion 13.

For example, the structure of the center region (in the region of the dashed line α1) of the semiconductor element 80 illustrated in FIG. 12 is the same structure as the structure illustrated in FIG. 4A. That is, in the center region, upper surface areas of the P+ diffusion regions 12b are substantially the same area as each other, and upper surface areas of the N+ diffusion regions 12a are substantially the same area as each other. All of the upper surface areas of the P+ diffusion regions 12b are greater than all of the upper surface areas of the N+ diffusion regions 12a. For example, the upper surface area of one P+ diffusion region 12b is substantially twice the upper surface area of one N+ diffusion region 12a. With such a configuration, in the upper surface of the semiconductor structure portions 13 (structure portion 13a in FIG. 4A) formed in the center region, a ratio of the area (area of the upper surface) of the N+ diffusion region 12a and the area (area of the upper surface) of the P+ diffusion region 12b does not satisfy 1:1, and the total area of the upper surfaces of the P+ diffusion regions 12b is greater than (for example, substantially twice) the total area of the upper surfaces of the N+ diffusion regions 12a.

Regarding the semiconductor structure portions 13 (structure portion 13a in FIG. 4A) formed in the center region, a ratio of the sum of lengths of the N+ diffusion regions 12a and the sum of lengths of the P+ diffusion regions 12b at a boundary portion of the first region portion 11 side does not satisfy 1:1 on the upper surface of the semiconductor structure portion 13. The sum of the lengths of the P+ diffusion regions 12b is substantially twice the sum of the lengths of the N+ diffusion regions 12a. Specifically, the length of a boundary portion (boundary portion of the first region portion 11 side) formed on both of the right and the left sides also corresponds to W1 on a surface of one N+ diffusion region 12a. Thus, in all of the N+ diffusion regions 12a, the length of the boundary portion (boundary portion of the first region portion 11 side) formed on both of the right and the left sides corresponds to the W1. The length of the boundary portion (boundary portion of the first region portion 11 side) formed on both of the right and the left sides corresponds to W2 on a surface of one P+ diffusion region 12b. Thus, in all of the P+ diffusion regions 12b, the length of the boundary portion (boundary portion of the first region portion 11 side) formed on both of the right and the left sides corresponds to the W2. The length W2 of the boundary portion of one P+ diffusion region 12b is greater than the length W1 of the boundary portion of one N+ diffusion region 12a. For example, the length W2 of the boundary portion of one P+ diffusion region 12b is substantially twice the length W1 of the boundary portion of one N+ diffusion region 12a.

In the semiconductor element 80 illustrated in FIG. 12, a structure of the outside of the center region (region which is out of the region of the dashed line α11 and is in the element region AR) is the same structure as the structure illustrated in FIG. 4B or the structure illustrated in FIG. 4C, for example. For example, when the structure of the outside of the center region is set to be the structure illustrated in FIG. 4B, upper surface areas of the P+ diffusion regions 12b are also substantially the same area as each other and upper surface areas of the N+ diffusion regions 12a are also substantially the same area as each other in the outside of the center region (region which is out of the region of the dashed line α1 and is in the element region AR). All of the upper surface areas of the N+ diffusion regions 12a are greater than all of the upper surface areas of the P+ diffusion regions 12b. For example, the upper surface area of one N+ diffusion region 12a is substantially twice the upper surface area of one P+ diffusion region 12b. With such a configuration, in the upper surface of the semiconductor structure portion 13 (structure portion 13b in FIG. 4B) formed on the outside of the center region, a ratio of an area (area of the upper surface) of the N+ diffusion region 12a and the area (area of the upper surface) of the P+ diffusion region 12b does not satisfy 1:1, and the total area of the upper surfaces of the N+ diffusion region 12a is greater than (for example, substantially twice) the total area of the upper surfaces of the P+ diffusion region 12b.

In the upper surface of the semiconductor structure portion 13 (structure portion 13b in FIG. 4B) on the outside of the center region, a ratio of the sum of lengths of the N+ diffusion regions 12a and the sum of lengths of the P+ diffusion regions 12b at the boundary portion of the first region portion 11 side does not satisfy 1:1. The sum of the lengths of the N+ diffusion region 12a is substantially twice the sum of the lengths of the P+ diffusion region 12b. Specifically, the length of the boundary portion (boundary portion of the first region portion 11 side) formed on both of the right and the left sides also corresponds to the W1 on a surface of one N+ diffusion region 12a. Thus, in all of the N+ diffusion regions 12a, the length of the boundary portion (boundary portion of the first region portion 11 side) formed on both of the right and the left sides corresponds to the W1. The length of the boundary portion (boundary portion of the first region portion 11 side) formed on both of the right and the left sides corresponds to the W2 on a surface of one P+ diffusion region 12b. Thus, in all of the P+ diffusion regions 12b, the length of the boundary portion (boundary portion of the first region portion 11 side) formed on both of the right and the left sides corresponds to the W2. The length W1 of the boundary portion of one N+ diffusion region 12a is greater than the length W2 of the boundary portion of one P+ diffusion region 12b. For example, the length W1 of the boundary portion of one N+ diffusion region 12a is substantially twice the length W2 of the boundary portion of one P+ diffusion region 12b.

According to such a configuration, a region in which the tolerance is regarded relatively as important and a region in which the ON-resistance is regarded relatively as important can be individually formed in a single element. Thus, an element in which loss in area is suppressed and the degree of the freedom is high in a single element can be designed.

The proportion of the P+ diffusion region 12b is relatively high in the semiconductor structure portion 13 of the center region such that a parasitic operation at the central portion of an element, at which heat is easily generated, is suppressed. The vicinity of the central portion of the element is a place at which heat easily stays in an L-load operation, and the like and a parasitic operation may be performed due to heat generation. However, in this configuration, the parasitic operation is easily suppressed and tolerance in the vicinity of the center region is relatively high by increasing the proportion of the P+ diffusion region 12b in the center region.

In a circumference side (outside of the center region) of the element in which heat is generated smaller than that in the center region, the proportion of the N+ diffusion region 12a is relatively high in the semiconductor structure portion 13. In this configuration, the quantity of a current on a peripheral side can be increased such that the quantity of a current corresponding to an increase of the proportion of the P+ diffusion region 12b in the center region is at least partially supplemented. With such a configuration, low ON-resistance and high tolerance in the entirety of the element can be realized.

Fifth Embodiment

Next, a fifth embodiment will be described.

Figure 13:
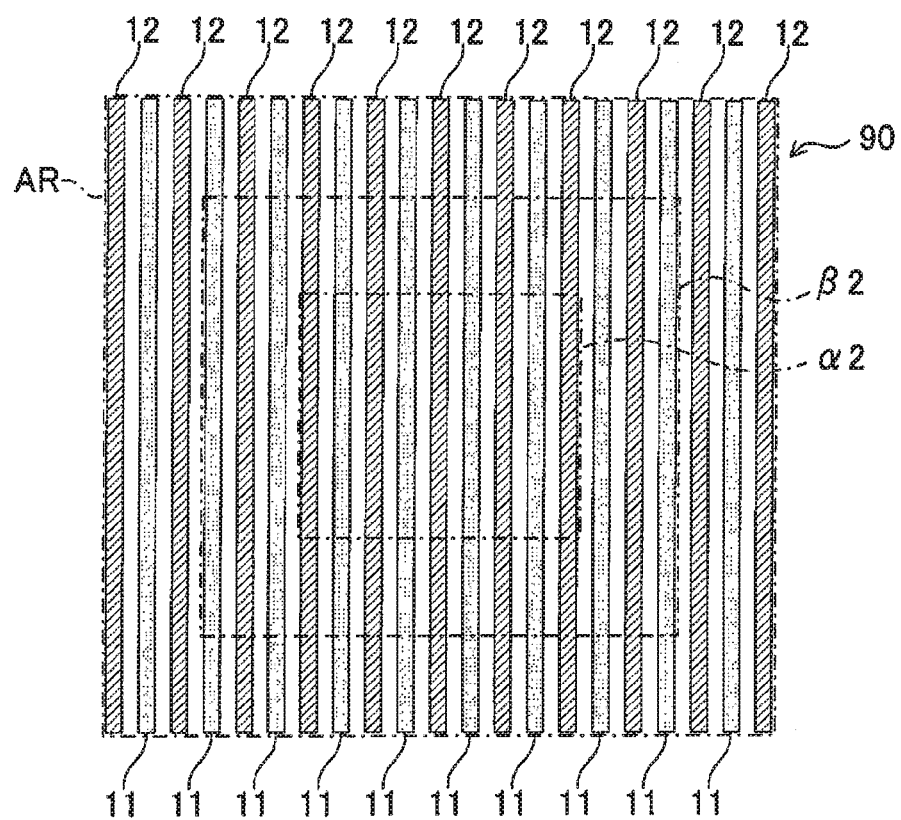
FIG. 13 is a schematic diagram schematically illustrating a planar configuration of a surface side of a semiconductor element constituting a semiconductor device according to a fifth embodiment.
Figure 14:
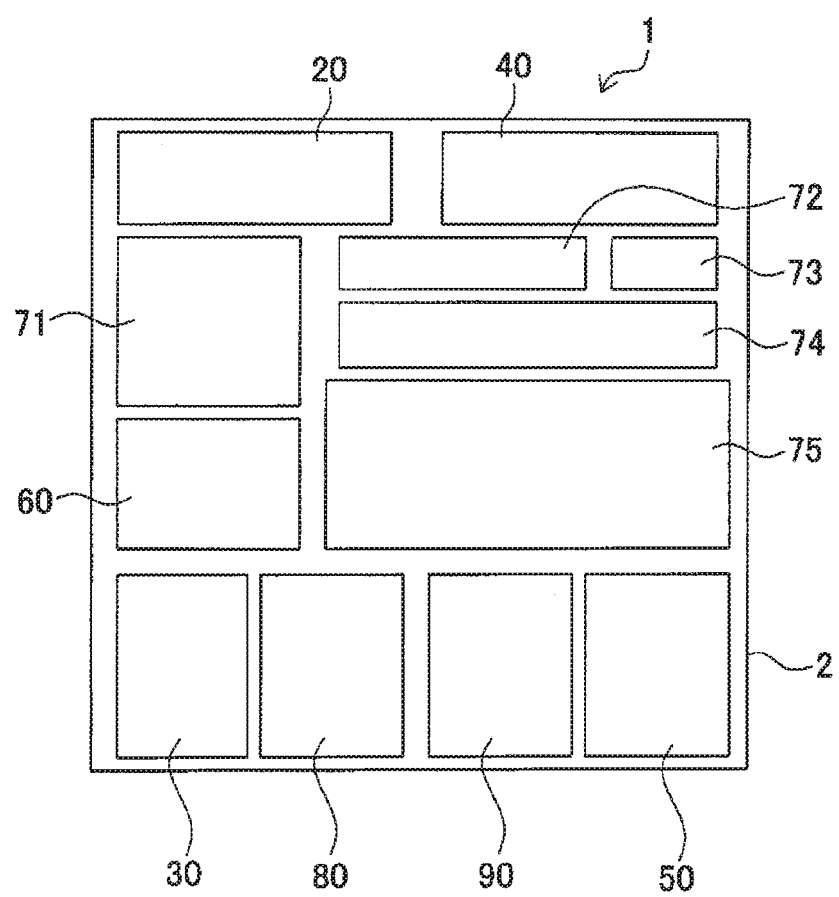
FIG. 14 is a schematic diagram schematically illustrating a planar configuration of the semiconductor device according to the fifth embodiment.

The fifth embodiment is different from the semiconductor device 1 according to the first embodiment in that any semiconductor element (for example, one of plural semiconductor elements 30) is substituted with a semiconductor element 90 illustrated in FIG. 13 in the semiconductor device 1 illustrated in FIG. 1. Otherwise, the fifth embodiment is the same as the semiconductor device 1 according to the first embodiment. For example, a semiconductor device 1 according to the fifth embodiment has a device structure as in FIG. 14, as the entirety of the device.

In the semiconductor device 1 having this configuration, plural semiconductor elements such as the semiconductor element 90 are formed on a predetermined surface 2a side of a semiconductor substrate 2. The semiconductor element 90 has the same basic structure as those in the above-described semiconductor elements 20, 30, 60, and 80. Only a shape of each of an N+ diffusion region 12a and a P+ diffusion region 12b in a second region portion 12 is different from that in the semiconductor elements 20, 30, 60, and 80. As illustrated in FIG. 13, a first region portion 11 and the second region portion 12 are formed on the surface 2a side of the semiconductor substrate 2 in the semiconductor element 90. Similarly to in FIG. 2, the first region portion 11 is a portion at which the N+ diffusion region 12a is formed so as to have a longitudinal shape, and the second region portion 12 is a disposition portion of a semiconductor structure portion 13 at a position separated from the first region portion 11, in which the N+ diffusion region 12a and the P+ diffusion region 12b are alternately formed. A gate electrode 14 is disposed over a region between the first region portion 11 and the second region portion 12 in the semiconductor substrate 2, with an insulating film 16 interposed between the region and the gate electrode 14.

In the semiconductor device 1 having this configuration, plural types of the semiconductor structure portions 13 in which ratios of the N+ diffusion region 12a and the P+ diffusion region 12b are different from each other are provided in the second region portion 12. In this configuration, the plural types of the semiconductor structure portions 13 are provided in the single semiconductor element 90.

As illustrated in FIG. 13, in the semiconductor element 90, a first type semiconductor structure portion 13 (for example, structure portion 13a illustrated in FIG. 4A) is provided in a predetermined central region (specifically, a region of a dashed line α2 illustrated in FIG. 13) separated from an element circumferential portion of the semiconductor element 90. In the first type semiconductor structure portion 13, a ratio of the N+ diffusion region 12a and the P+ diffusion region 12b is set to a predetermined first ratio. Plural types of semiconductor structure portions 13 are provided on an element circumferential portion side (specifically, portion which is out of the region of the dashed line α2 and is in an element region AR) of the first type semiconductor structure portion 13 formed at the center region (portion which is in the region of the dashed line α2). The plural types of semiconductor structure portions 13 have types different from the first type and have a structure in which the percentage of the N+ diffusion region 12a is greater than that in the first type semiconductor structure portion 13. Specifically, the percentage of the N+ diffusion region 12a in the semiconductor structure portion 13 is gradually increased from the center region to the element circumferential portion.

For example, the structure of the center region (in the region of the dashed line α2) of the semiconductor element 90 is the same structure as the structure illustrated in FIG. 4A. A structure of the region (portion which is out of the region of the dashed line α2 and is in a region of a dashed line β2) on the outside of the right vicinity of the center region is the same structure as the structure illustrated in FIG. 4C. A structure of a region (portion out of the region of the dashed line β2 and the like) on the outside of the regions is the same structure as the structure illustrated in FIG. 4B.

In this manner, in the semiconductor element 90, a ratio of an area (upper surface area) of the N+ diffusion region 12a and an area (upper surface area) of the P+ diffusion region 12b on the upper surface of the semiconductor structure portion 13 is changed from the center region to the outside in stages. As being close to a region on the outside, the percentage of the upper surface area of the N+ diffusion region 12a is increased. Thus, a ratio of the sum of lengths of the N+ diffusion regions 12a and sum of lengths of the P+ diffusion regions 12b at a boundary portion of the first region portion 11 side on the upper surface of the semiconductor structure portion 13 is changed from the center region to the outside in stages. As being close to a region on the outside, the sum of lengths of the N+ diffusion regions 12a is increased. According to such a configuration, the similar advantages to in the fourth embodiment are obtained and the advantages can be improved more by subdividing the region.

In the above-described example of FIG. 13, a configuration in which the ratio is concentrically changed from the center region to the outside in three stages is exemplified. However, a configuration in which the ratio is concentrically changed in four or more stages may be made. In addition, the number of stages in which the ratio is changed in a transverse direction may be difficult from the number of stages in which the ratio is changed in a vertical direction. For example, a configuration in which the ratio is concentrically changed from the center region to the outside in the transverse direction in three stages, and the ratio is concentrically changed from the center region to the outside in the vertical direction in two stages may be made.

Other Embodiment

The present disclosure is not limited to the embodiments obtained through the above descriptions and the drawings. For example, the following embodiments are also included in a technical range of the present disclosure.

In the first embodiment, the second embodiment of FIG. 9A, the third embodiment, and the like, an example in which the first conductivity type semiconductor regions are disposed at a constant gap and the second conductivity type semiconductor regions are disposed at a constant gap in the second region portion 12 is exemplified. However, in any configuration of any of the embodiments, a disposition gap between the first conductivity type semiconductor regions or a disposition gap between the second conductivity type semiconductor regions may not be the constant gap. In the second region portion 12 of the semiconductor device 20 or the semiconductor device 30 according to the first embodiment, it is desired that the total width of the N+ diffusion regions 12a is different from the total width of the P+ diffusion regions 12b in the predetermined direction. In the second region portion 52 in the third embodiment, it is desired that the total width of the N+ diffusion regions 52a is different from the total width of the P+ diffusion regions 52b in the predetermined direction. In a case of the second region portion 12 in the second embodiment, it is desired that the total width of the N+ diffusion regions 12a is different from the total width of the P+ diffusion regions 12b in the vertical direction, and the total width of the N+ diffusion regions 12a is different from the total width of the P+ diffusion regions 12b in the transverse direction.

In the first embodiment, the second embodiment, and the like, an example in which the P+ diffusion region 12b is substantially twice the N+ diffusion region 12a is used as an example in which the percentage of the P+ diffusion region 12h is greater than the percentage of the N+ diffusion region 12a in the second region portion. However, the P+ diffusion region 12b may be substantially three times the diffusion region 12a, or the ratio of the P+ diffusion region 12b and the N+ diffusion region 12a may have a value other than the above values. An example in which the N+ diffusion region 12a is substantially twice the P+ diffusion region 12b is used as an example in which the percentage of the N+ diffusion region 12a is greater than the percentage of the P+ diffusion region 12b in the second region portion. However, the N+ diffusion region 12a may be substantially three times the P+ diffusion region 12b, or the ratio of the P+ diffusion region 12b and the N+ diffusion region 12a may have a value other than the above values.

In the semiconductor element 40 in the second embodiment and the like, mainly, an example in which the percentage of the P+ diffusion region 12b is greater than the percentage of the N+ diffusion region 12a in the second region portion 12 is used. However, the reverse may be made. That is, the percentage of the N+ diffusion region 12a may be greater than the percentage of the P+ diffusion region 12b.

In the third embodiment and the like, mainly, an example in which the percentage of the P+ diffusion region 52a is greater than the percentage of the N+ diffusion region 52b in the second region portion 52 is used. However, the reverse may be made. That is, the percentage of the N+ diffusion region 52b may be greater than the percentage of the P+ diffusion region 52a.

In the first embodiment, and the like, the semiconductor device 1 has the configuration in which the semiconductor elements 20, 30, and 60 are mixed. However, a mix configuration is not limited thereto. In each of the embodiments, a modification example thereof, other embodiments, or the like, any one type of semiconductor elements described above and one or more types of another semiconductor elements described above may be mixed and mounted in the semiconductor substrate 2.

Figure 15A:
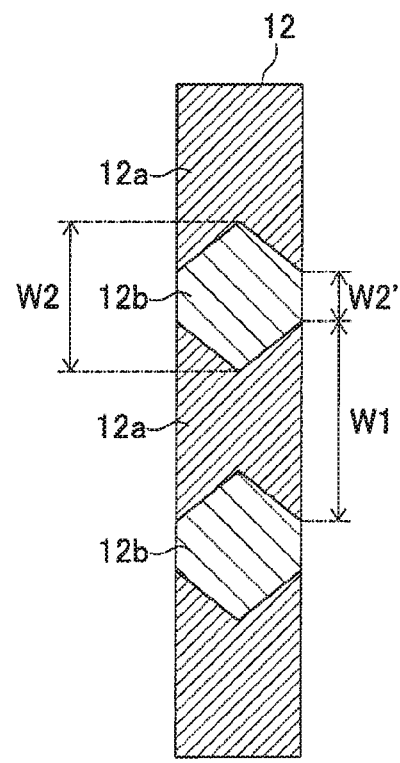
FIG. 15A relates to another embodiment, and is a diagram illustrating a modification example which is obtained by changing the second region portion in the semiconductor elements illustrated in FIGS. 4A, 4B, and 4C.
Figure 15B:
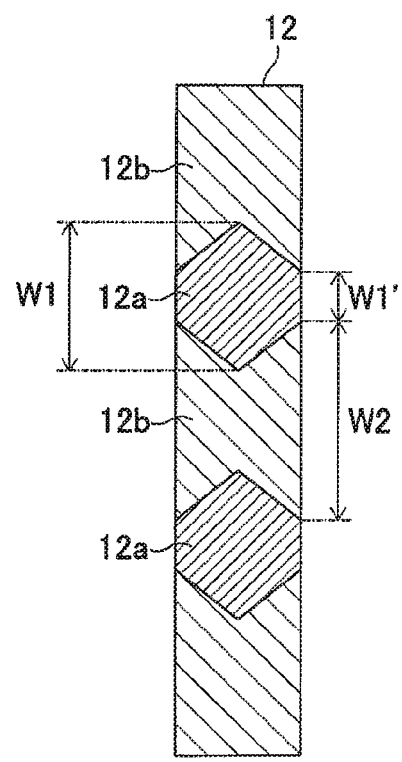
FIG. 15B is a diagram illustrating a modification example different from that in FIG. 15A.

In the embodiments, an example in which the shape of the N+ diffusion region and the P+ diffusion region in the second region portion is a simple rectangular shape which is held with a predetermined width in the entirety of the region in the transverse direction is used. However, any shape of a diffusion region is not limited thereto. For example, the shape may be a shape as in FIGS. 15A and 15B. Alternatively, the shape may be a shape other than these shapes. In any case, the width W1 of the N+ diffusion region 12*a* may be set to be the maximum length of the N+ diffusion region 12*a* in the predetermined direction (direction in which the second region portion 12 is extended). In addition, as in FIG. 15B, a length WV of an outer circumference portion of the N+ diffusion region 12*a* in the predetermined direction (direction in which the second region portion 12 is extended) may be used as the width of the N+ diffusion region 12*a*. The width W2 of the P+ diffusion region 12*b* may be set to be the maximum length of the P+ diffusion region 12*b* in the predetermined direction (direction in which the second region portion 12 is extended). In addition, as in FIG. 15A, a length W2' of an outer circumference portion of the P+ diffusion region 12*b* in the predetermined direction (direction in which the second region portion 12 is extended) may be used as the width of the P+ diffusion region 12*b*.

Figure 16:
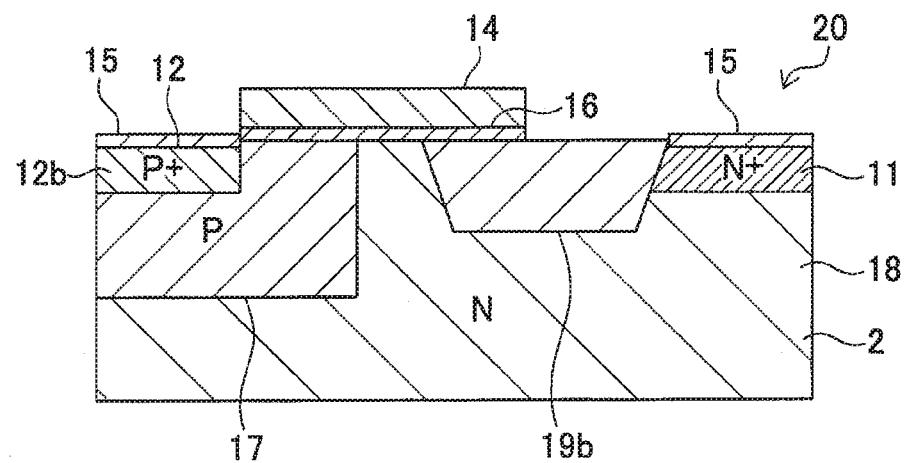
FIG. 16 relates to another embodiment, and is a schematic sectional diagram illustrating a modification example which is obtained by changing the sectional structure of the semiconductor element to a sectional structure different from that in FIG. 3A.
Figure 17:
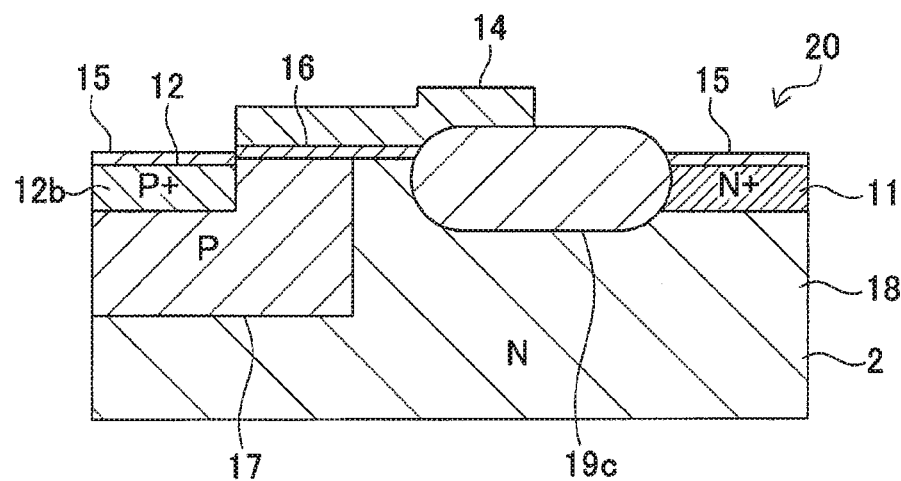
FIG. 17 relates to another embodiment, and is a schematic sectional diagram illustrating a modification example which is obtained by changing the sectional structure of the semiconductor element to a sectional structure different from those in FIGS. 3A and 16.

In the above embodiments, as illustrated in FIGS. 3A and 3B, the configuration in which the insulating film 19*a* formed of $SiO_2$ is provided is exemplified. However, in the configuration of any embodiment, other insulating film structures may be used. For example, as in FIG. 16, an insulating film 19*b* having a shallow trench isolation (STI) structure may be provided instead of the insulating film 19*a* in FIGS. 3A and 3B. In addition, as in FIG. 17, an insulating film 19*c* having a local oxidation of silicon (LOCOS) structure may be provided instead of the insulating film 19*a* in FIGS. 3A and 3B. In the configuration of any embodiment, a salicide layer 15 may be provided on the first region portion or the second region portion as in FIGS. 16 and 17.

The invention claimed is:

1. A semiconductor device, comprising:
   a semiconductor substrate; and
   at least one semiconductor element arranged on a predetermined surface side of the semiconductor substrate, wherein
   the at least one semiconductor element includes:
      a first region portion at which an N type semiconductor region is arranged on the predetermined surface side of the semiconductor substrate,
      a second region portion which is arranged at a position separated from the first region portion, on the predetermined surface side of the semiconductor substrate, and in which a plurality of semiconductor structure portions is arranged, an N type semiconductor region and a P type semiconductor region alternately provided in each of the plurality of semiconductor structure portions, and
      a gate electrode arranged on a region in the semiconductor substrate between the first region portion and the second region portion, with an insulating film interposed between the semiconductor substrate and the gate electrode;
   the plurality of semiconductor structure portions with a variety of types, which are different in a ratio of a volume of the N type semiconductor region to a volume of the P type semiconductor region, are provided at the second region portion; and
   any one of the plurality of semiconductor structure portions has a structure in which a proportion of the volume of the P type semiconductor region is greater than a proportion of the volume of the N type semiconductor region.

2. The semiconductor device according to claim 1, wherein:
   the at least one semiconductor element in which the first region portion is extended in a predetermined direction so as to have a longitudinal shape and the second region portion is extended in the predetermined direction so as to have a longitudinal shape at the position separated from the first region portion is provided on the predetermined surface side of the semiconductor substrate;
   the N type semiconductor region and the P type semiconductor region are alternately provided in the predetermined direction at the second region portion; and
   a ratio of a width of the N type semiconductor region in the predetermined direction to a width of the P type semiconductor region in the predetermined direction is different in each of the plurality of types of semiconductor structure portions which are included at the second region portion.

3. The semiconductor device according to claim 1, wherein:
   the at least one semiconductor element in which a plurality of partial structures are arranged is provided on the predetermined surface side of the semiconductor substrate, and
   in each of the plurality of partial structure, the first region portion is arranged at a predetermined central portion and the second region portion is arranged at the position separated from the first region portion so as to surround the first region portion,
   the second region portion includes: a longitudinal region where the N type semiconductor region and the P type semiconductor region are alternately arranged in a predetermined vertical direction; and a transverse region where the N type semiconductor region and the P type semiconductor region are alternately arranged in a transverse direction orthogonal to the vertical direction; and
   a ratio of the volume of the N type semiconductor region to the volume of the P type semiconductor region is different in each of the plurality of semiconductor structure portions with the variety of types which are included at the second region portion.

4. The semiconductor device according to claim 1, wherein any one of the plurality of semiconductor structure portions has a structure in which the percentage of the volume of the N type semiconductor region is greater than the percentage of the volume of the P type semiconductor region.

5. The semiconductor device according to claim 1, wherein any one of the plurality of semiconductor structure portions has a structure in which the percentage of the volume of the N type semiconductor region is the same as the percentage of the volume of the P type semiconductor region.

6. The semiconductor device according to claim 1, wherein the plurality of semiconductor structure portions, each of which has different type, are respectively provided in the at least one semiconductor element.

7. The semiconductor device according to claim 1, wherein the plurality of semiconductor structure portions with the variety of types are provided in the at least one semiconductor element.

8. The semiconductor device according to claim 7, wherein:
   one of the plurality of semiconductor structure portions has a first type provided at a predetermined central region separated from an element circumferential portion of the semiconductor element in the at least one semiconductor element, and in the one of the plurality of semiconductor structure portions with the first type, the ratio of the volume of the N type semiconductor region to the volume of the P type semiconductor region is set as a predetermined first ratio;

the element circumferential portion is exterior to the predetermined central region; and the plurality of semiconductor structure portions, each of which has a different type from the first type and has a structure in which a proportion of the volume of the N type semiconductor region is greater than the proportion in the first type of the semiconductor structure portion, are provided on an element circumferential portion side of the first type of the semiconductor structure portion in the semiconductor element.

9. The semiconductor device according to claim 8, wherein, in the at least one semiconductor element, the proportion of the volume of the N type semiconductor region in each of the plurality of semiconductor structure portions gradually becomes greater as being closer to the element circumferential portion from the predetermined central region.

10. A semiconductor device, comprising:

a semiconductor substrate; and at least one semiconductor element arranged on a predetermined surface side of the semiconductor substrate, wherein the at least one semiconductor element includes:
  a first region portion at which an N type semiconductor region is arranged on the predetermined surface side of the semiconductor substrate,
  a second region portion which is arranged at a position separated from the first region portion, on the predetermined surface side of the semiconductor substrate, and in which a plurality of semiconductor structure portions is arranged, an N type semiconductor region and a P type semiconductor region alternately provided in each of the plurality of semiconductor structure portions, and
  a gate electrode arranged on a region in the semiconductor substrate between the first region portion and the second region portion, with an insulating film interposed between the semiconductor substrate and the gate electrode;

the plurality of semiconductor structure portions with a variety of types, which are different in a ratio of a volume of the N type semiconductor region to a volume of the P type semiconductor region, are provided at the second region portion;

the plurality of semiconductor structure portions with the variety of types are provided in the at least one semiconductor element;

one of the plurality of semiconductor structure portions has a first type provided at a predetermined central region separated from an element circumferential portion of the semiconductor element in the at least one semiconductor element, and in the one of the plurality of semiconductor structure portions with the first type, the ratio of the volume of the N type semiconductor region to the volume of the P type semiconductor region is set as a predetermined first ratio;

the element circumferential portion is exterior to the predetermined central region; and the plurality of semiconductor structure portions, each of which has a different type from the first type and has a structure in which a proportion of the volume of the N type semiconductor region is greater than the proportion in the first type of the semiconductor structure portion, are provided on an element circumferential portion side of the first type of the semiconductor structure portion in the semiconductor element.

* * * * *